US008342120B2

(12) United States Patent
Kim et al.

(10) Patent No.: US 8,342,120 B2
(45) Date of Patent: Jan. 1, 2013

(54) APPARATUSES AND METHODS FOR APPLYING ONE OR MORE MATERIALS ON ONE OR MORE SUBSTRATES

(75) Inventors: Kyekyoon Kim, Champaign, IL (US); Hyungsoo Choi, Champaign, IL (US); Philip Edward Heil, III, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 873 days.

(21) Appl. No.: 12/404,398

(22) Filed: Mar. 16, 2009

(65) Prior Publication Data

US 2009/0230222 A1    Sep. 17, 2009

Related U.S. Application Data

(60) Provisional application No. 61/069,360, filed on Mar. 14, 2008.

(51) Int. Cl.
| | | |
|---|---|---|
| B05B 7/00 | (2006.01) |
| B05B 7/06 | (2006.01) |
| B05B 5/025 | (2006.01) |
| B05B 11/00 | (2006.01) |
| B05B 1/14 | (2006.01) |
| B05B 1/20 | (2006.01) |
| B05B 5/00 | (2006.01) |
| B05C 11/11 | (2006.01) |
| B05C 5/00 | (2006.01) |
| B05C 5/02 | (2006.01) |
| B05C 15/00 | (2006.01) |
| A62C 2/08 | (2006.01) |
| E21F 5/04 | (2006.01) |
| A62C 37/08 | (2006.01) |
| F23D 11/38 | (2006.01) |
| F23D 14/48 | (2006.01) |
| F23D 11/32 | (2006.01) |
| B01J 19/08 | (2006.01) |
| G21H 1/00 | (2006.01) |
| G21H 5/00 | (2006.01) |
| H01F 41/00 | (2006.01) |
| B05D 1/04 | (2006.01) |
| B05D 1/32 | (2006.01) |
| B05D 1/06 | (2006.01) |
| H05C 1/00 | (2006.01) |
| B05B 5/053 | (2006.01) |
| G03G 15/02 | (2006.01) |
| H01T 23/00 | (2006.01) |
| H05F 3/00 | (2006.01) |
| C12M 1/42 | (2006.01) |
| C12M 3/00 | (2006.01) |
| C12M 1/00 | (2006.01) |

(52) U.S. Cl. ........ 118/620; 118/624; 118/627; 118/629; 118/667; 118/712; 118/504; 118/300; 118/313; 239/698; 239/292; 239/701; 239/690; 239/697; 239/548; 239/550; 239/556; 239/557; 239/566; 427/457; 427/458; 427/466; 427/469; 361/228; 361/235; 435/285.2; 435/285.3

(58) Field of Classification Search ........................ None
See application file for complete search history.

(56) References Cited

U.S. PATENT DOCUMENTS 4,574,092 A    3/1986 Gourdine
(Continued)

FOREIGN PATENT DOCUMENTS

WO    WO 03070381 A1 *  8/2003
(Continued)

OTHER PUBLICATIONS

Kim et al., "Generation of Charged Drops of Insulating Liquids by Electrostatic Spraying", Journal of Applied Physics, vol. 47, No. 5, May 1975, pp. 1964-1969.

(Continued)

*Primary Examiner* — Dah-Wei Yuan
*Assistant Examiner* — Binu Thomas
(74) *Attorney, Agent, or Firm* — Guntin Meles & Gust, PLC; Ed Guntin

(57) ABSTRACT

A system that incorporates teachings of the present disclosure may include, for example, an apparatus having a tube with an ingress opening to receive a liquid, and an egress opening to release the liquid, a conductor positioned in a conduit of the tube, the conductor and the conduit having dimensions to cause a surface tension of the liquid to prevent a constant flow of the liquid from the egress opening, and a power supply coupled to the conductor to apply a charge to the liquid to overcome the surface tension and form at the egress opening a single jet stream of the liquid applicable on a substrate to create a pattern. The single jet stream can be controllable in part by a viscosity of the liquid. Additional embodiments are disclosed.

25 Claims, 26 Drawing Sheets

U.S. PATENT DOCUMENTS

| | | | |
|---|---|---|---|
| 4,748,043 A | | 5/1988 | Seaver et al. |
| 4,762,553 A | | 8/1988 | Savage et al. |
| 4,762,975 A | | 8/1988 | Mahoney et al. |
| 5,344,676 A | | 9/1994 | Kim et al. |
| 5,948,483 A | | 9/1999 | Kim et al. |
| 7,434,912 B2 * | 10/2008 | Murata | 347/44 |
| 2003/0077399 A1 * | 4/2003 | Potyrailo et al. | 118/715 |
| 2005/0133616 A1 * | 6/2005 | Shimoda et al. | 239/135 |
| 2008/0141936 A1 * | 6/2008 | Pui et al. | 118/629 |
| 2010/0155496 A1 * | 6/2010 | Stark et al. | 239/3 |

FOREIGN PATENT DOCUMENTS

WO    WO 2008142393 A1 * 11/2008

OTHER PUBLICATIONS

Gu et al., "Flow-Limited Field-Injection Electrostatic Spraying for Controlled Formation of Charged Multiple Jets of Precursor Solutions: Theory and Application" Applied Physics Letters 87, 2005, pp. 084107-1 to 084107-3.

Wikipedia, "Electrospinning", 7-page article; http://en.wikipedia.org/wiki/Electrospinning; Web Site last visited Mar. 13, 2009.

Wikipedia, "File:Electrospinning setup.png", 2-page article; http://en.wikipedia.org/wiki/File:Electrospinning_setup.png; Web Site last visited Mar. 2, 2009.

Wikipedia, "Taylor Cone", 2-page article; http://en.wikipedia.org/wiki/Taylor_cone; Web Site last visited Mar. 2, 2009.

* cited by examiner

Example of a 4-nozzle syringe pump

Multi-nozzle system from provisional patent

Substrate – conductivity:

Taylor cone contact mode

100μm Fodel silver paste lines patterned on uncoated insulating glass (5cm x 5cm)

Taylor cone contact mode

100μm TiO₂ nanoparticle paste lines patterned on conductive FTO-coated glass (5cm x 5cm)

Silver grids:

Silver grid directly deposited on 5cm x 5cm FTO at 175° C

Silver grid formed by paste deposition and annealing

|   | Solution Concentration (mole/L) | Solute | Solvent | Product | Nature of Product |
|---|---|---|---|---|---|
| 1 | 0.1 M | Zn-trifluoroacetate | Methanol | ZnO | piezoelectric, semiconductor thin films |
| 2 | 0.1 M<br>0.2 M<br>0.3 M | Y-trifluoroacetate<br>Ba-trifluoroacetate<br>Cu-trifluoroacetate | Methanol | $YBa_2Cu_3O_7$ | superconductor thin films |
| 3 | 0.1 M | Pd-trifluoroacetate | Water | Pd | metallic nanoparticles |
| 4 | 0.1 M | Ta-ethoxide | Methanol | $Ta_2O_5$ | insulator, thin films and nanoparticles |
| 5 | 0.1 M | Ag-trifluoroacetate | Methanol | Ag | metallic nanoparticles |
| 6 | 0.1 M<br>0.1 M | Pd-trifluoroacetate<br>Ag-trifluoroacetate | Methanol<br>Methanol | $Pd_{0.5}Ag_{0.5}$ | inter-metallic nanoparticles |

FIG. 28

$BaTiO_3$, $SrTiO_3$, BST, ZnO, Iron Oxide, NiO, Cobalt Oxide, PZT, PZN, MgO, $TiO_2$, TiON, $SiO_2$, $Al_2O_3$, Mn-doped $Zn_2SiO_4$, Cu, Ag, Ni, Pd, PVA, $MgF_2$, $CaF_2$, PEDOT, GCP, Other polymers

FIG. 29

APPARATUSES AND METHODS FOR APPLYING ONE OR MORE MATERIALS ON ONE OR MORE SUBSTRATES

PRIOR APPLICATION

The present application claims the benefit of priority to U.S. Provisional Application No. 61/069,360 filed on Mar. 14, 2008, which is hereby incorporated herein by reference.

FIELD OF THE DISCLOSURE

The present disclosure relates generally to techniques for applying a material on a substrate, and more specifically to apparatuses and methods for applying one or more materials on one or more substrates.

BACKGROUND

In an electrostatic spraying apparatus, electric charge can be supplied to a surface of a liquid. When the repulsive forces within the liquid caused by the electric charge exceed the surface tension maintaining the surface of the liquid, the surface of the liquid can explosively disrupt to form small jets. In some applications, the small jets can break up into streams of charged liquid clusters in the form of nanodrops (liquid phase) or nanoparticles (solid phase formed by solidifying nanodrops). The resulting stream of nanodrops can be directed onto a surface of a target material or substrate, which over time, can form a thin film on the surface.

Electrostatic spraying of a single jet stream of a liquid has been demonstrated by existing devices. These devices however have not demonstrated a single jet stream that is sufficiently stable to accurately and repeatedly apply desired patterns on a target material or substrate.

BRIEF DESCRIPTION OF THE DRAWINGS

FIGS. 28-29 depict illustrations of possible embodiments of a liquid used by the apparatus of FIG. 1, 2 or 8 for pattern application on a substrate.

DETAILED DESCRIPTION

Figure 1A:
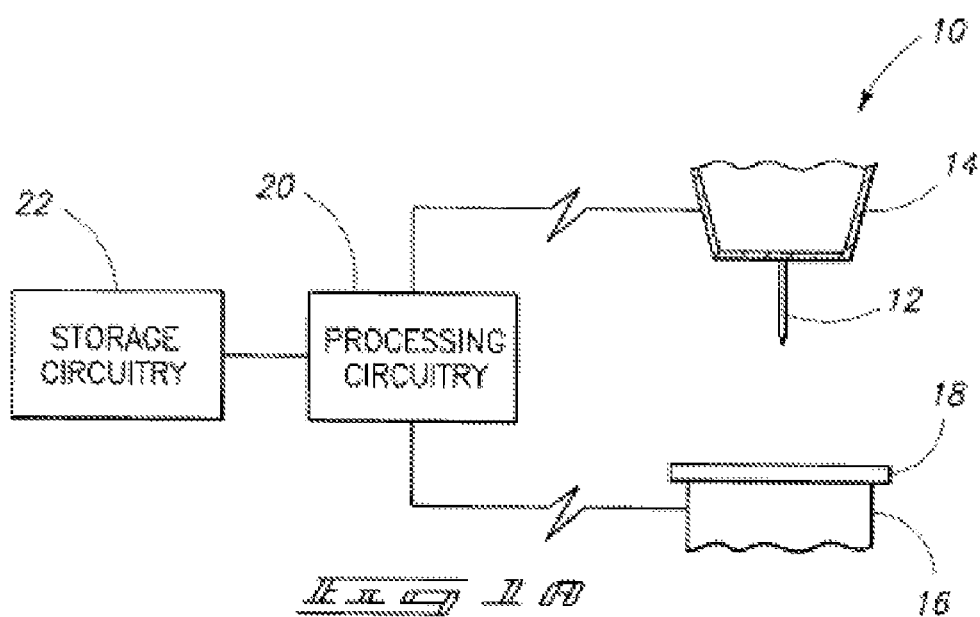
FIG. 1A depicts an illustrative embodiment of a pattern application apparatus.

One embodiment of the present disclosure entails an apparatus having a tube with an ingress opening to receive a liquid, and an egress opening to release the liquid, a conductor positioned in a conduit of the tube, the conductor and the conduit having dimensions to cause a surface tension of the liquid to prevent a constant flow of the liquid from the egress opening, and a power supply coupled to the conductor to apply a charge to the liquid to overcome the surface tension and form at the egress opening a single jet stream of the liquid applicable on a substrate to create a pattern. The single jet stream can be controllable in part by a viscosity of the liquid.

Another embodiment of the present disclosure entails an apparatus having a tube with an ingress opening to receive a liquid, and an egress opening to release the liquid, and a conductor positioned in a conduit of the tube, the conductor used for applying a charge to the liquid to emit from the egress opening of the tube a single jet stream of the liquid. The single jet stream can be managed in part by at least one controllable property of the liquid.

Yet another embodiment of the present disclosure entails manufacturing at least a portion of a device by way of applying one or more materials on one or more components of the device with one or more single jet streams, each single jet stream comprising a liquid associated with at least one of the one or more materials. The one or more single jet streams can be supplied by an apparatus having one or more tubes each to receive a corresponding liquid, and a conductor positioned in a conduit of each tube, the conductor used for applying a charge to the received liquid to cause the emission of one of the one or more single jet streams applied on the one or more components. Each of the one or more single jet streams can be managed by a controllable property of the liquid associated with the single jet stream.

Another embodiment of the present disclosure entails a device having a component constructed in part by applying one or more materials on one or more components of the device with one or more single jet streams, each single jet stream corresponds to a liquid associated with at least one of the one or more materials. The one or more single jet streams can be supplied by an apparatus having one or more tubes with a conductor positioned in a conduit of each tube, the conductor of each tube used for applying a charge to liquid received by the tube to cause the emission of one of the one or more single jet streams. Each of the one or more single jet streams can be managed in part by a controllable property of the liquid.

Another embodiment of the present disclosure entails a computer-readable storage medium having computer instructions to control an apparatus that applies one or more patterns on a substrate with a single jet stream, the apparatus comprising a tube having a conductor positioned therein, the conductor used for applying a charge to liquid received by the tube to emit from the tube the single jet stream. The single jet stream can be managed in part by a modifiable property of the liquid.

Figure 2A:
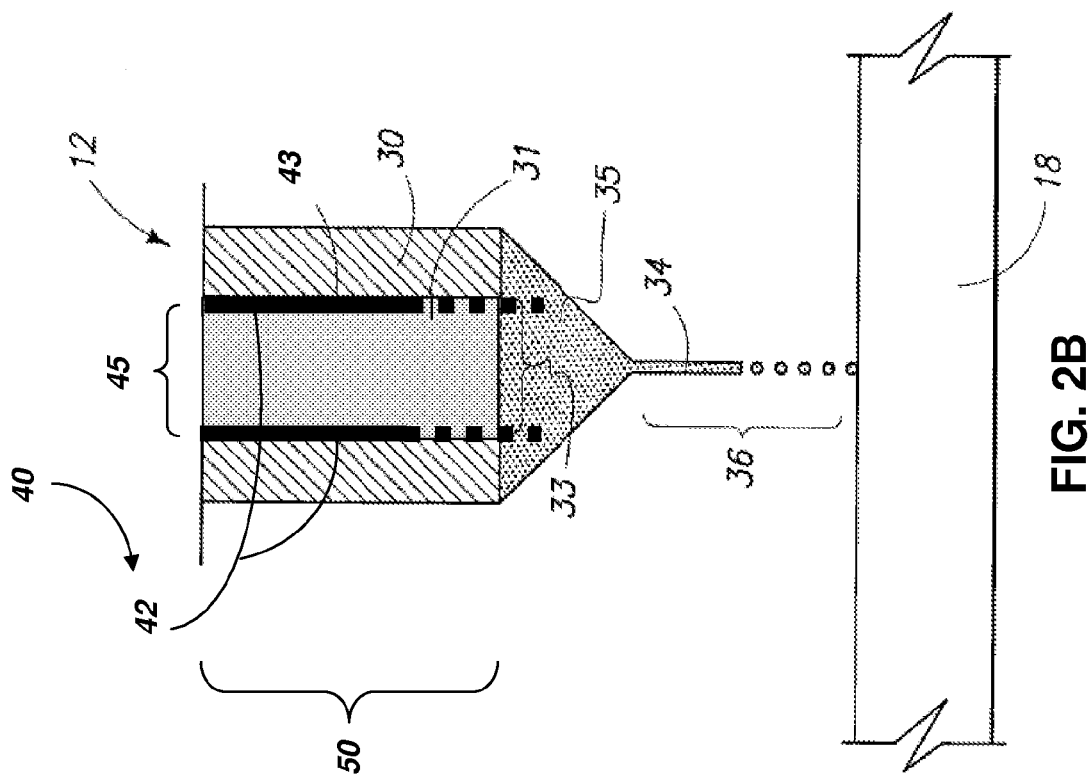
FIG. 2A-2D depict illustrative embodiments of a nozzle of the apparatus.

FIGS. 1A and 2A illustrate an apparatus 10 for applying on a substrate 18 fine or coarse patterns with a single-jet stream generated by the apparatus 10. Apparatus 10 can include generally an applicator 12 configured to receive a liquid from reservoir 14. While referred to as reservoir 14, element 14 can also be a conduit configured to convey and/or channel a solution to be deposited from a syringe pump or other liquid injection source. The substrate 18 can be coupled to a stage 16 which can be moved in at least one dimension (X, Y, and/or Z) using a common linear motor, or similar mechanism. The applicator 12 can also be attached to a similar mechanism so that its location can be controlled on any axis (X, Y, and/or Z). The present disclosure contemplates that any combination the applicator 12 and the stage 16 can be coupled to a mechanism that controls relative positioning between the applicator 12 and the substrate 18 attached to the stage 16. Configuring apparatus 10 in such a manner can allow an operator to arrange applicator 12 with sufficient proximity to substrate 18 to apply patterns of any kind.

The apparatus 10 can include processing circuitry 20 and storage circuitry 22. Processing circuitry 20 can be coupled to either one or both of the stage 16 and applicator 12. Processing circuitry 20 can be implemented as a controller or other structure configured to execute instructions including, for example, software and/or firmware instructions. Other example embodiments of processing circuitry 20 can include a desktop or laptop computer, a server, a mainframe, customized hardware logic, and/or in structures such as a PGA, FPGA, or ASIC configured for controlling operations of the apparatus 10.

The processing circuitry 20 can be configured to control the operational parameters of the applicator 12 and the stage component 16. Configurable parameters of the applicator 12 and stage 16 can include the charge density of the liquid, the flow rate of the liquid traveling through the applicator 12, monitoring the viscosity and the dielectric constant of the liquid flowing through applicator 12, relative positioning of the applicator 12 and the substrate 18 held by the stage 16, temperature control of the substrate 18 by way of a common temperature control device, and so on.

Processing circuitry 20 can also be configured to store and access data from storage circuitry 22. Storage circuitry 22 can be configured to store in a processor useable media electronic data and/or programming data such as executable instructions (e.g., software and/or firmware), or other digital information. Processor useable media can include any article of manufacture which can contain, store, or maintain programming, data, and/or other digital information for use by or in connection with an instruction execution system such as the processing circuitry 20. For example, processor useable media may include any one of physical media such as electronic, magnetic, optical, electro-magnetic, or semiconductor storage media. Some specific examples of processor useable media include, but are not limited to, a portable magnetic computer diskette, such as a floppy diskette, zip disc, hard drive, random access memory, read only memory, flash memory, cache memory, and/or other configurations capable of storing programming instructions, data, or other digital information.

Storage circuitry 22 can for example be used to store a plurality of data sets. These data sets can include specific parameters for specific substrates and liquids being deposited on the substrates. For example, in certain instances where a silver line is deposited from a silver liquid solution from reservoir 14 via applicator 12 over a glass substrate 18, storage circuitry 22 can include a data set specific to any combination of deposition parameters. These parameters can include, for example, the type of solution, the type of substrate, the desired pattern, the flow rate parameter, a liquid charge density parameter, temperature control of the substrate, and so on.

FIGS. 2A-2D describe embodiments of a portion of the applicator 12 operating as a nozzle 50 for depositing and/or applying fine or coarse patterns of a material on a substrate 18. The nozzle 50 can include a tube 30 such as a capillary tube having a conduit 43 with an ingress opening 45 and an egress opening 33. The capillary tube can be of insulating material. The ingress opening 45 can be coupled to the reservoir 14 of FIG. 1A or another form of a fluid delivery device such as a syringe pump for directing liquid 31 through the tube 30 (see FIG. 7).

An electrical conductor 40 can be positioned in the conduit 43 of the tube 30 in a variety of ways to control the charge density of the liquid 31. The conductor 40 can be of any material with conductive properties for applying a charge to the liquid 31. In an embodiment, the electrical conductor 40 can be in the form of a hollow cylinder 41 such as a "sleeve" (herein referred to as sleeve 41) illustrated by the cross-section of FIG. 2A. The sleeve 41 can be co-axially positioned in the conduit 43 so that some of the liquid 31 travels within the inner walls of the sleeve 41 and a portion travels between the sleeve 41 and the conduit 43. Although the sleeve 41 is shown to have an axial length and positioning that does not extend from the ingress opening 33, other embodiments are possible. For instance, the sleeve 41 can be shorter than what is shown in FIG. 2A, or it can be longer. The sleeve 41 can reach or extend beyond the egress opening 33 as shown by the dashed lines. The sleeve 41 can have a wider or narrower diameter than is shown. The sleeve 41 does not have to be co-axially positioned in the conduit 43, it can be positioned closer to one side of the conduit 43 than the other. The thickness of the walls of the sleeve 41 can be thick or thin. Any number of suitable embodiments of the sleeve 41 are applicable to the present disclosure.

Figure 2B:
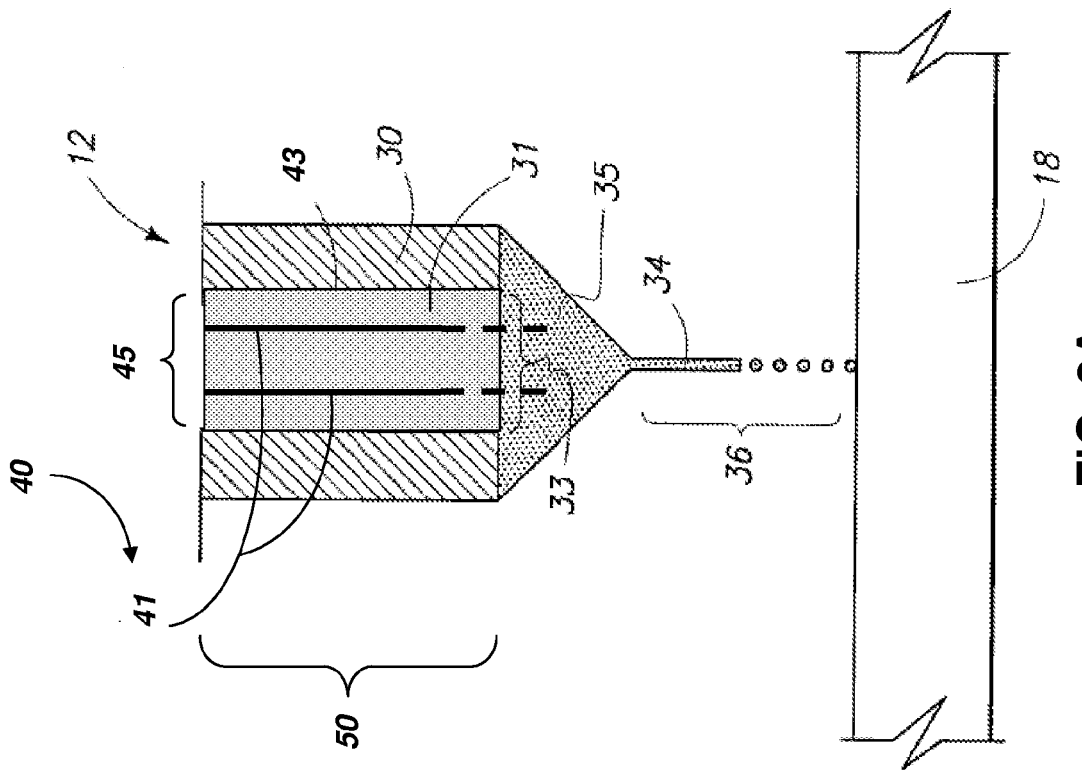

In another embodiment, the electrical conductor 40 can be in the form of a hollow cylinder 42 such as a "sleeve" (herein referred to as sleeve 42) coupled to the inside walls of the conduit 43 of the tube 30 as illustrated by the cross-section of FIG. 2B. Similar to the previous embodiment, the sleeve 42 can be coaxially positioned in the conduit 43 or with an offset, have an axial length less than or extending from the egress opening 33 (see dashed lines), have a variety of thicknesses, and so on. In yet another embodiment, the electrical conductor 40 can be in the form of a solid conductor 32 as shown by cross-section in FIG. 2C. The solid conductor 32 can be a thin diameter electrode with a nano-sharp needle tip, a partially blunt tip, or blunt tip. The length, positioning of the conduit 43, and thickness of the solid conductor 32 can also be varied.

It should be noted that the electric field emitted from the tip of the solid conductor 40 is proportional to a ratio of the voltage applied to the conductor 40 and the diameter of the tip of the conductor 40. Under a condition for example where the voltage applied to the solid conductor 40 is constant, the electric field generated by the tip of a nano-sharp needle will be greater than the electric field generated by a blunt tip of a greater diameter. Accordingly, a nano-sharp needle conductor 40 can provide operational benefits in managing the charge density of a precursor solution flowing through the tube 30.

Although not shown, the foregoing embodiments can also be combined. For instance the solid conductor of FIG. 2C can be combined with one of the sleeves 41 and 42 of FIG. 2A or 2B. In this embodiment, the solid conductor 32 can be surrounded by one of sleeves 41 and 42. In yet another embodiment, the sleeves 41 and 42 can be combined as concentric sleeves. It should be evident from these illustrations that the conductor 40 can have numerous embodiments, and that there can also be numerous placements of the conductor 40 in the conduit 43. These non-disclosed embodiments are contemplated by the present disclosure.

Figure 2C:
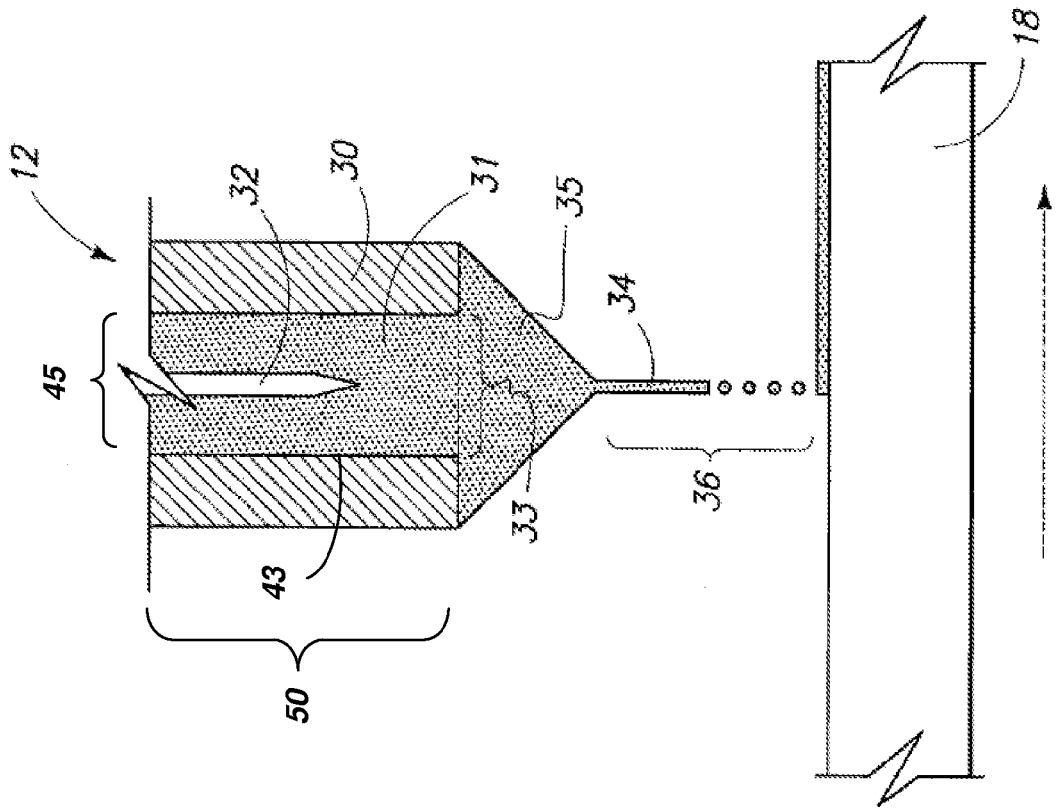
Figure 2D:
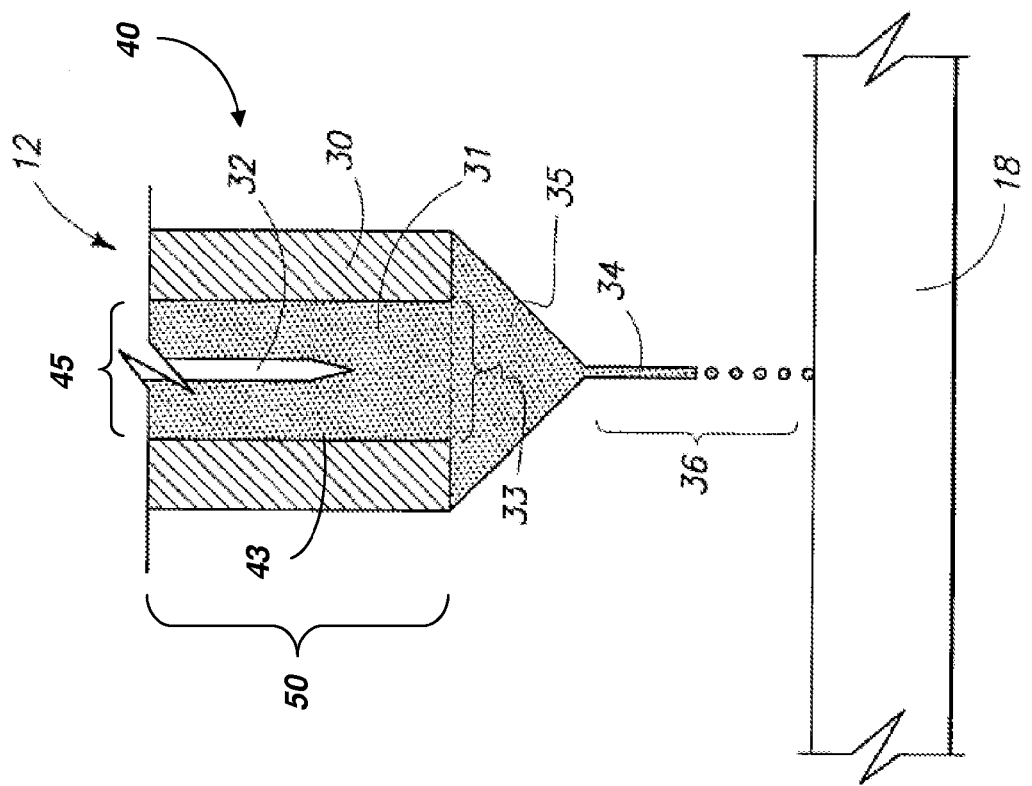
Figure 7:
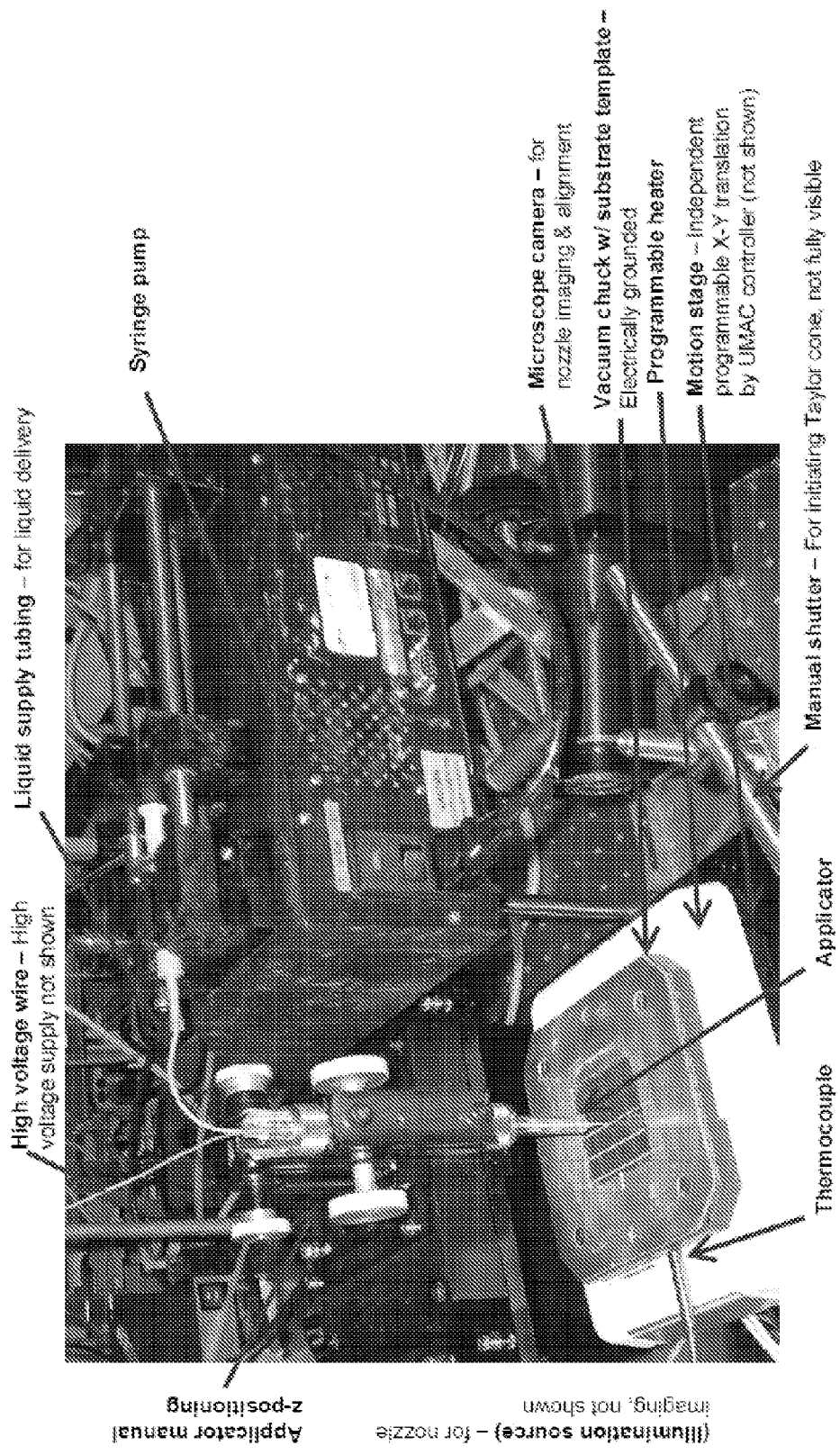
FIG. 7 depicts an illustrative embodiment of additional devices that can be used with the apparatus.

The conductor 40 illustrated in FIGS. 2A-2C can be coupled by wire to a high voltage power supply (see FIG. 7). A stable and repeatable single jet stream 34 can be applied to a substrate 18 by controlling the voltage applied to the conductor 40, the flow rate of the liquid 31 through the tube 30, and taking into account the viscosity of the liquid and the dielectric constant of the solution, the surface tension of the liquid 31, and so on. In one embodiment, cone 35, commonly referred to as a "Taylor cone", can form when an electrical charge is applied to the conductor 40. Under the right parametric conditions, a stable single jet stream 34 can emanate such as to enable the applicator 12 to "consistently" apply desirable patterns on substrate 18.

Figure 3:
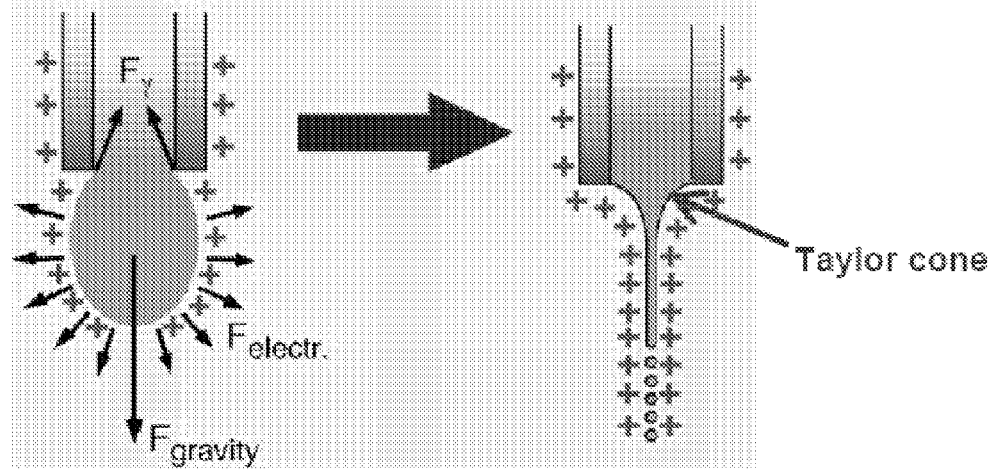
FIG. 3 depicts an illustrative embodiment of a process used by the apparatus of FIGS. 2A-2B to generate a single jet stream.

Before an electrical charge is applied to the conductor 40, the liquid 31 can protrude from the egress opening 33 of the nozzle 50 in the form of a drop such as shown in FIG. 3. The viscosity and surface tension properties ($F_\gamma$) of the liquid can prevent it from causing a continuous flow from the egress opening 33 while the conductor 40 is in a neutral state. As a charge is applied to the liquid 31 by way of conductor 40 (not shown in FIG. 3 for ease of illustration), Coulomb repulsion forces caused by the surface charges on the liquid ($F_{electr.}$) oppose the surface tension forces, thereby generating the Taylor cone 35. With increasing charge density, an instability on the Taylor cone surface leads to emanation of the single jet stream. The single jet stream can be stabilized by selecting a desired viscosity and dielectric constant for the liquid 31, and controlling the flow rate of said solution through the tube 30.

Figure 10:
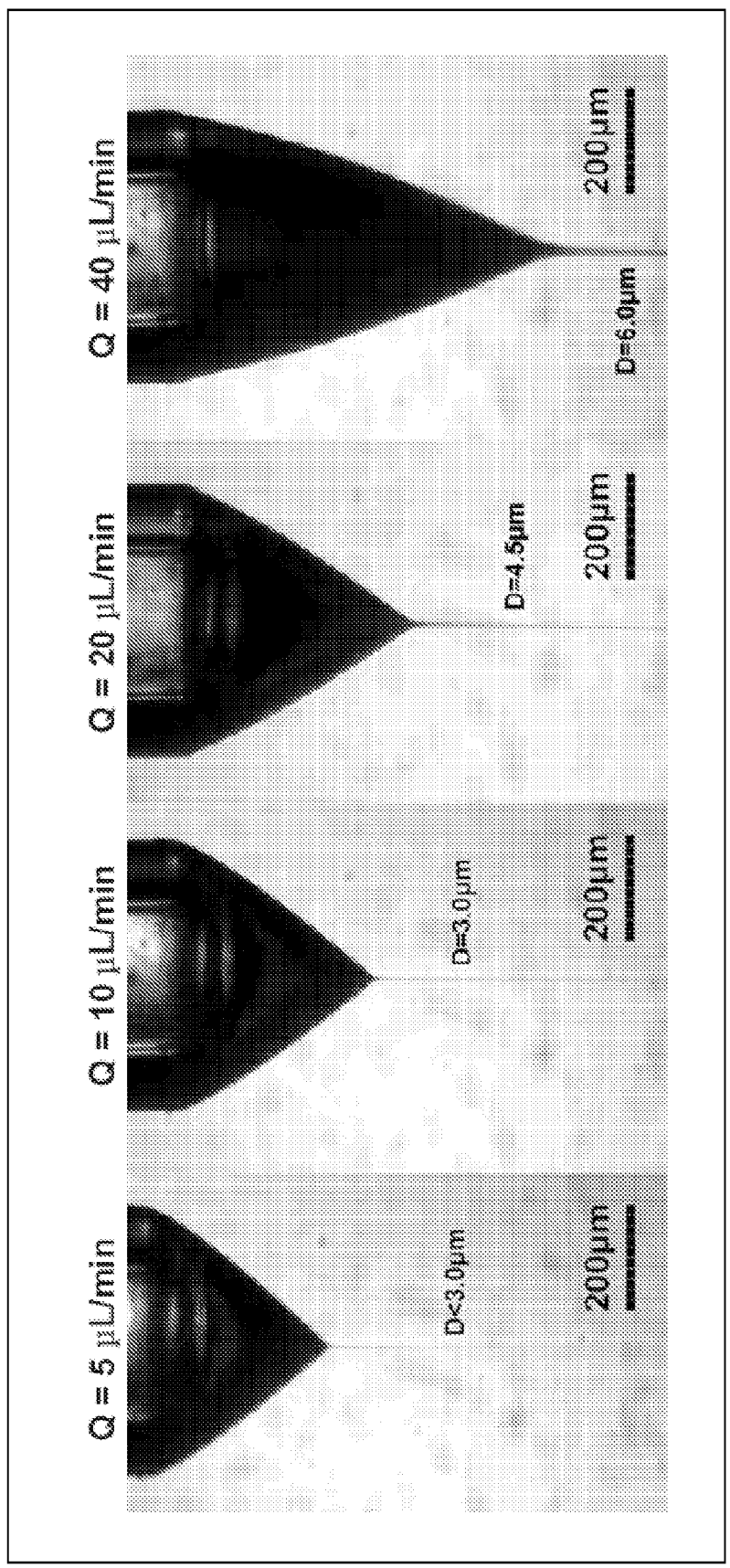
FIG. 10 depicts illustrative embodiments of stable single jet streams with varying diameters of thickness.

FIG. 10 provides several illustrations of a stable single jet stream produced repeatedly in a stable manner. By varying the flow rate (in micro liters per minute or $\mu L/min$), the diameter of the single jet stream can be varied from less than 3 micrometers ($\mu m$) to 6 $\mu m$. The diameter of the egress opening 33 of the nozzle 50 of FIG. 2 can range from 10 $\mu m$ to 2 mm or more. As the illustrations of FIG. 10 show, the stable single jet stream produced by the applicator 12 can be substantially smaller than the diameter of the nozzle 50. By varying the diameter of the single jet stream, ultra-fine patterns can be applied to a substrate 18, which has many industrial applications.

The liquid 31 can comprise a precursor solution of a variety of materials such as metals, metalorganic compounds, metal salts, sol-gel processed materials, ceramics, polymers, oligomers, oxides, hydroxides, hydrides, and/or one or more solvents combined with any of these materials. Some materials such as polymers can be heated to a molten state if a solvent is not desirable for a particular application. Surfactants can also be used to vary the surface tension of the precursor solution. Binders such as polyethylene glycol and ethyl cellulose can also be used to vary the viscosity of the precursor solution to thereby maintain a pattern structure applied to the substrate 18 that can be later removed using heat treatment. Other binders are possible. Metals can include for example silver or nickel from metalorganic precursors in solvent, silver from Dupont Fodel screen printable paste containing silver nanoparticles, or platinum from a precursor in Solaronix pastes. Polymers can include functional polymers such as PEDOT:PSS, P3HT or other polymers dispersed in solvent. Oxides can include titanium dioxide ($TiO_2$), titanium oxynitride (TiON) from metalorganic precursors in solvent, $TiO_2$ nanoparticle networks from Solaronix screen printable pastes, nickel oxide from metalorganic precursors in solvent, dielectric glass, or low-temperature glass from screen printable pastes.

The precursor solution can also comprise biomaterials and biological materials. For instance, the precursor solution can comprise a solution of chitosan, gelatin, alginate, agarose, peptides, proteins, therapeutic agents, cells, and DNA or protein molecules dispersed in solvent.

Figure 1B:
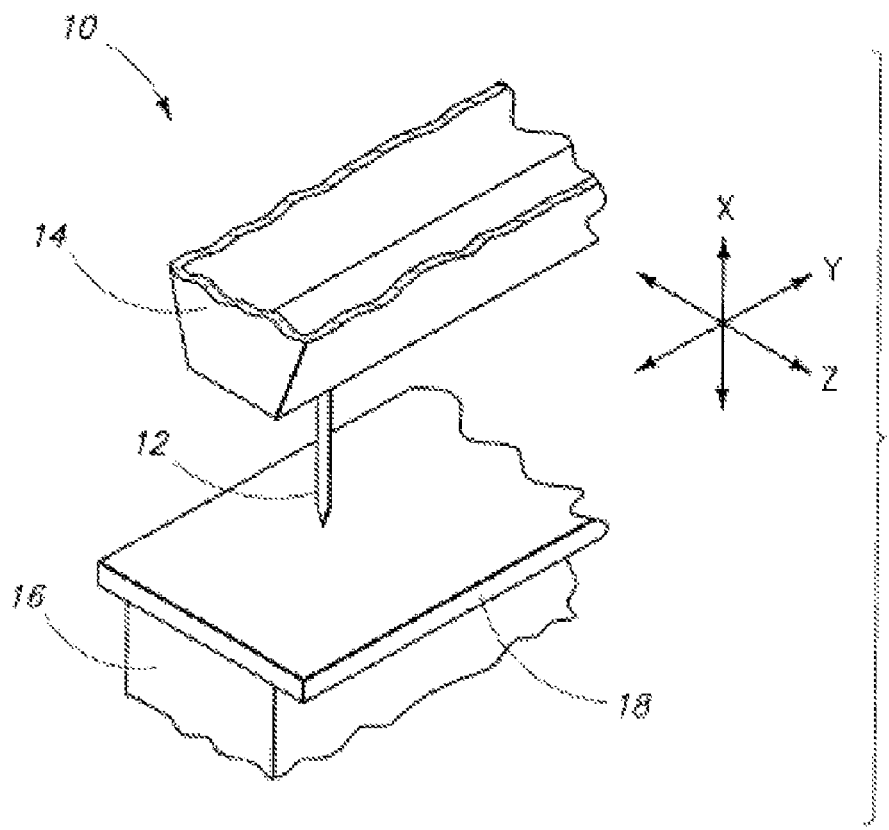
FIG. 1B depicts an illustrative embodiment of a perspective view of the apparatus of FIG. 1A.

The precursor solution created in any of these instances can also be controlled for a desired viscosity, conductivity, dielectric constant and surface tension. FIG. 28 provides an illustration of precursor solutions that can be used for application on a substrate 18. FIG. 29 further illustrates materials that have been deposited by apparatus 10 of FIG. 1, 2 or 8. It should be noted that FIGS. 28-29 are illustrative and non-limiting as it would be apparent to an artisan with ordinary skill in the art that there are nearly limitless solutions possible. Other precursor solutions are therefore contemplated by the present disclosure.

There are also nearly limitless variations in the operation of the apparatus 10 such as, for example, the flow rate of the precursor solution through the tube 30, the surface charge density created by the amount of charge applied by the conductor 40 controllable with a programmable power supply, the distance between the substrate 18 and the egress opening 36 (referred to herein as meniscus distance 36), and the multi-planar (1D, 2D or 3D) motion between the substrate 18 and the single jet stream. With so many combinations of precursor solutions and operation characteristics of the apparatus 10, innumerable patterns can be applied to substrate 18. The patterns generated by apparatus 10 can vary in thickness, material characteristics (e.g., resistivity, vertical height, pattern spreading, other geometries), format (e.g., contiguous patterns, patterns with discontinuities), and so on.

Figure 4:
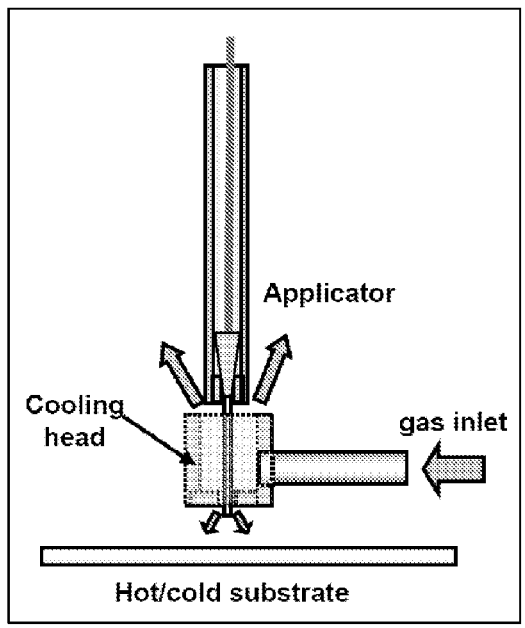
FIGS. 4-5 depict illustrative embodiments of housing assemblies which can be used to seal a portion of the apparatus of FIGS. 2A-2B.
Figure 5:
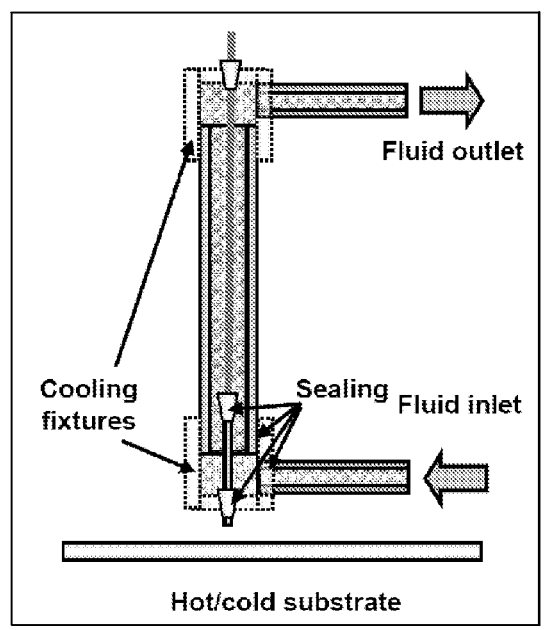

A housing assembly can be added to a portion of the apparatus 10 as shown in FIGS. 4 and 5. The housing assembly can be used to apply a gas or fluid for controlling a temperature of the precursor solution as it is being applied. The housing assembly can also be adapted to provide a hermetic seal with a portion of the nozzle 50 and the substrate 18 (not shown in FIG. 4 or 5). With a common pump or other mechanical extraction device, air and/or other gases can be extracted from the assembly to create a near vacuum seal. The housing assembly can be used in applications where environmental control of the application of precursor solutions is desirable.

Figure 6A:
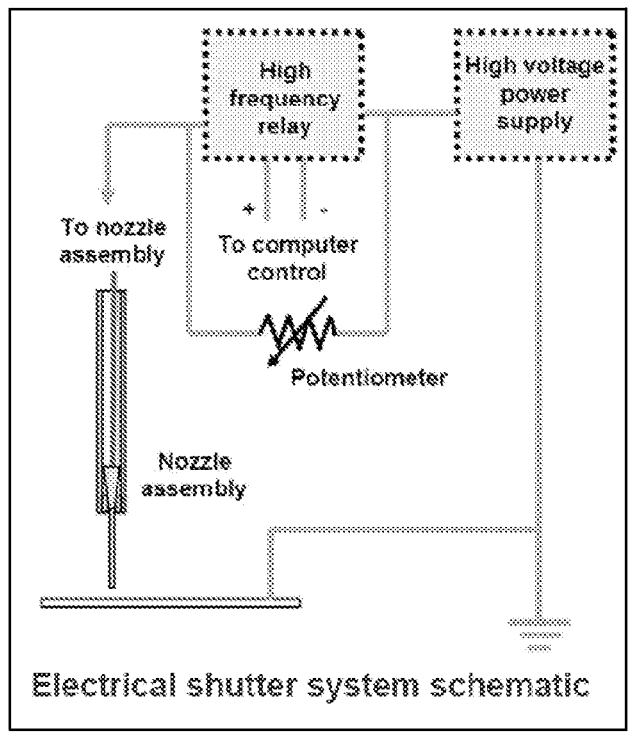
FIGS. 6A-6B depict illustrative embodiments to manage the application of pattern application.
Figure 6B:
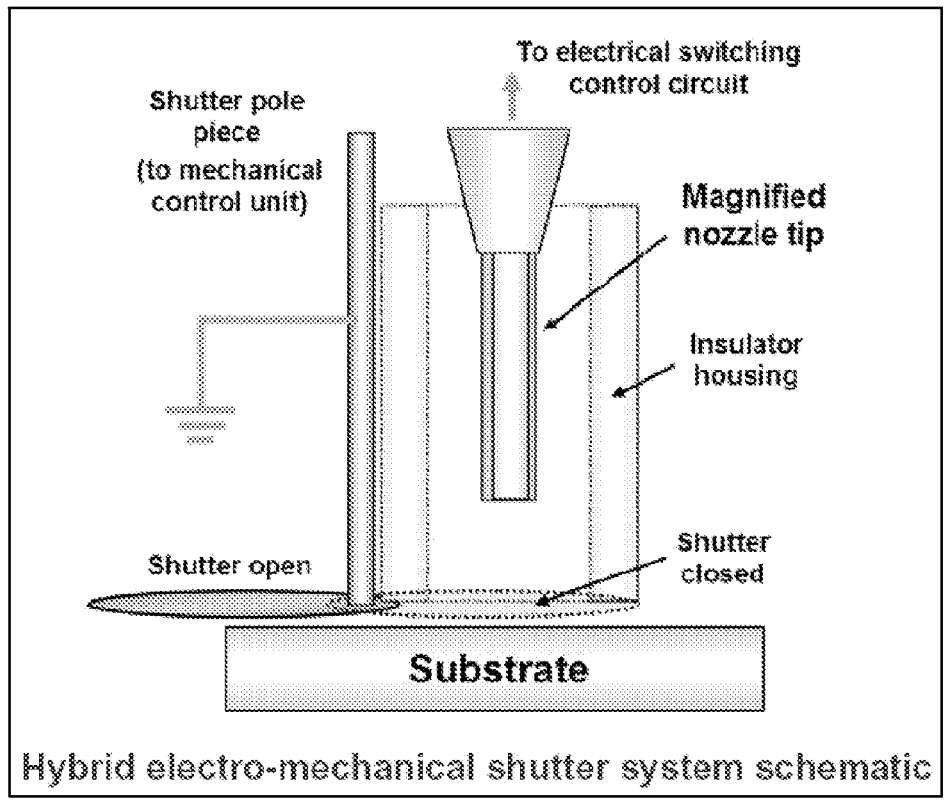

Other devices can be used with apparatus 10 to control its operational characteristics. For example, a common temperature application device can be coupled to the substrate 18 to either heat or cool the substrate 18 during material application. In yet another embodiment, an electrical or electro-mechanical shutter system as shown in FIGS. 6A and 6B, respectively, can be used to generate discontinuous patterns at high speed. The electrical shutter system can rely on the surface tension of the precursor solution to prevent continuous flow when the conductor 40 is in a neutral charge state, while the electro-mechanical shutter can combine both the electrical shutter concept with a mechanical shutter that can be controlled to obstruct or enable application with a common actuator mechanism.

Several operational devices can be added to the apparatus 10 for quality control. For instance, a thermal sensor can be used to measure the temperature of the substrate 18 and/or the precursor solution during application. The thermal sensor can be a common temperature sensor coupled to substrate 18, or an infrared sensor that can measure the temperature of the precursor solution while being applied. Additionally, an imaging sensor such as a microscope camera can be used to monitor the application process for accuracy. These additional components are shown in FIG. 7.

Figure 9:
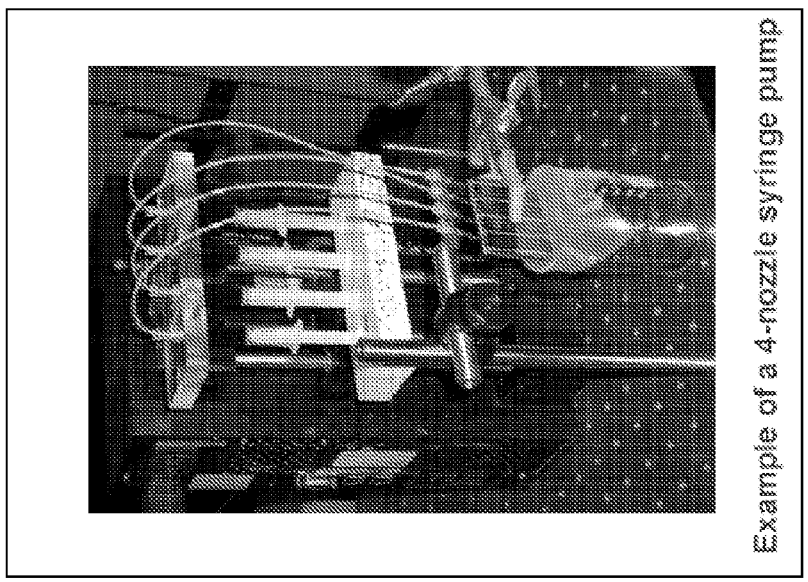
FIGS. 8-9 depict illustrative embodiments of a multi-nozzle apparatus.
Figure 8:
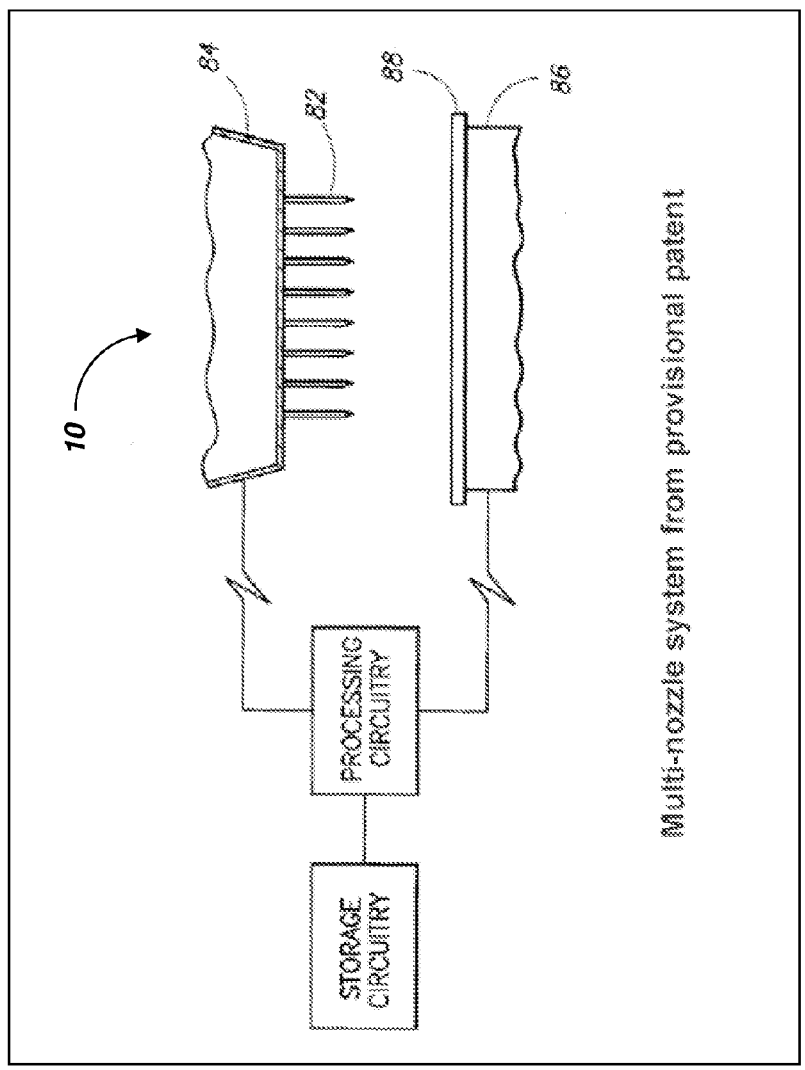

The apparatus 10 can also be adapted to have a plurality of nozzles 82 as shown in FIG. 8. The plurality of nozzles 82 can share a common reservoir 84, or each nozzle can be coupled to an independent fluid injection device, each providing a unique precursor solution managed by the processing circuitry 20 discussed previously. The plurality of nozzles 82 can generate single jet streams that can be applied synchronously or asynchronously between nozzles to form a variety of patterns on a single substrate 88 controlled by a staging device 86. Alternatively, the plurality of nozzles 82 can be used to apply patterns on a plurality of substrates each individually controlled by its own stage. In yet another embodiment, portions of the plurality of nozzles 82 can also be coupled to a staging device so that the nozzles and/or the substrate can be moved relative to each other in any direction as described earlier for the apparatus of FIG. 1B. FIG. 9 illustrates an apparatus 10 with four nozzles each coupled to a syringe pump.

It should be evident from the abovementioned operational characteristics of the apparatus 10 with a single nozzle (or multiplicity of nozzles) that there can be endless operational configurations of the apparatus 10 which can control the pattern application of materials on one or more substrates. It would be impractical to describe all the possible embodiments in the present disclosure. Nevertheless, these non-disclosed embodiments are contemplated and therefore considered relevant to the potential use of the apparatus 10 as described herein.

Figure 11:
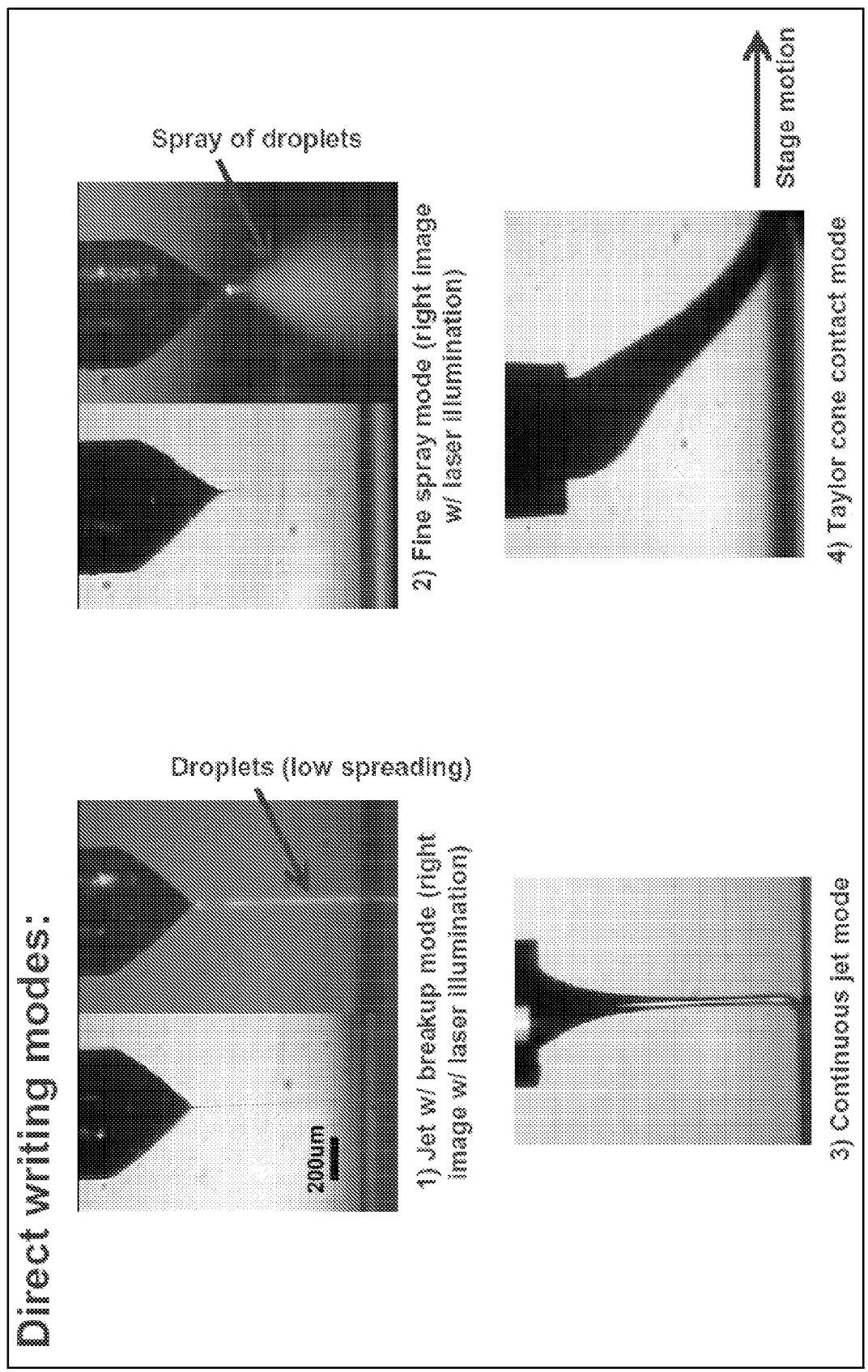
FIG. 11 depicts illustrative embodiments of modes of applying the single jet stream to one or more substrates.

With the above embodiments in mind, the present disclosure illustrates in FIG. 11 four distinct single jet streams that can be created in a stable, and repeatable manner by selecting one or more of the aforementioned precursor solutions and controlling one or more of the operational parameters of apparatus 10. In the illustrations of FIG. 11, the single jet stream can be described in two portions. A first portion can correspond to the Taylor cone, and a second portion can be described as a single stream which in some instances can transition to another state. In one embodiment, a single stream can emanate from the Taylor cone and transition to droplets before contacting the substrate 18—see item (1) of FIG. 11 (referred to herein as a "Jet with breakup mode"). The transitioning state from a single stream to droplets can be controlled by varying the meniscus distance 36 and/or utilizing a low viscosity precursor solution. The droplets can be as small as sub-micron droplets. In another embodiment, the single stream emanating from the Taylor cone can transition to a spray (which can generate nano droplets) before contacting the substrate 18 by increasing the charge density of a precursor solution having low viscosity—see item (2) of FIG. 11 (referred to herein as a "Jet with spray mode").

In another embodiment, the single stream emanating from the Taylor cone can remain continuous up to the point of contact with the substrate 18 without noticeably altering the Taylor cone by reducing the meniscus distance 36, using a higher viscosity solution, and/or increasing the flow rate of the solution—see item (3) of FIG. 11 (referred to herein as a "Continuous jet mode"). In yet another embodiment, the single stream emanating from the Taylor cone can remain continuous, but noticeably alter the Taylor cone by substantially reducing the meniscus distance 36 further than in the previous mode, using an even higher viscosity solution than in the previous mode, decreasing the flow rate of the solution, and/or reducing the lateral motion between the substrate 18 and the single stream—see item (4) of FIG. 11 (referred to herein as a "Taylor cone contact mode").

It should be noted that although the Jet with breakup mode is illustrated in FIGS. 2A-2D, the other modes of FIG. 11 could have been demonstrated in the variants of FIG. 2.

Figure 12:
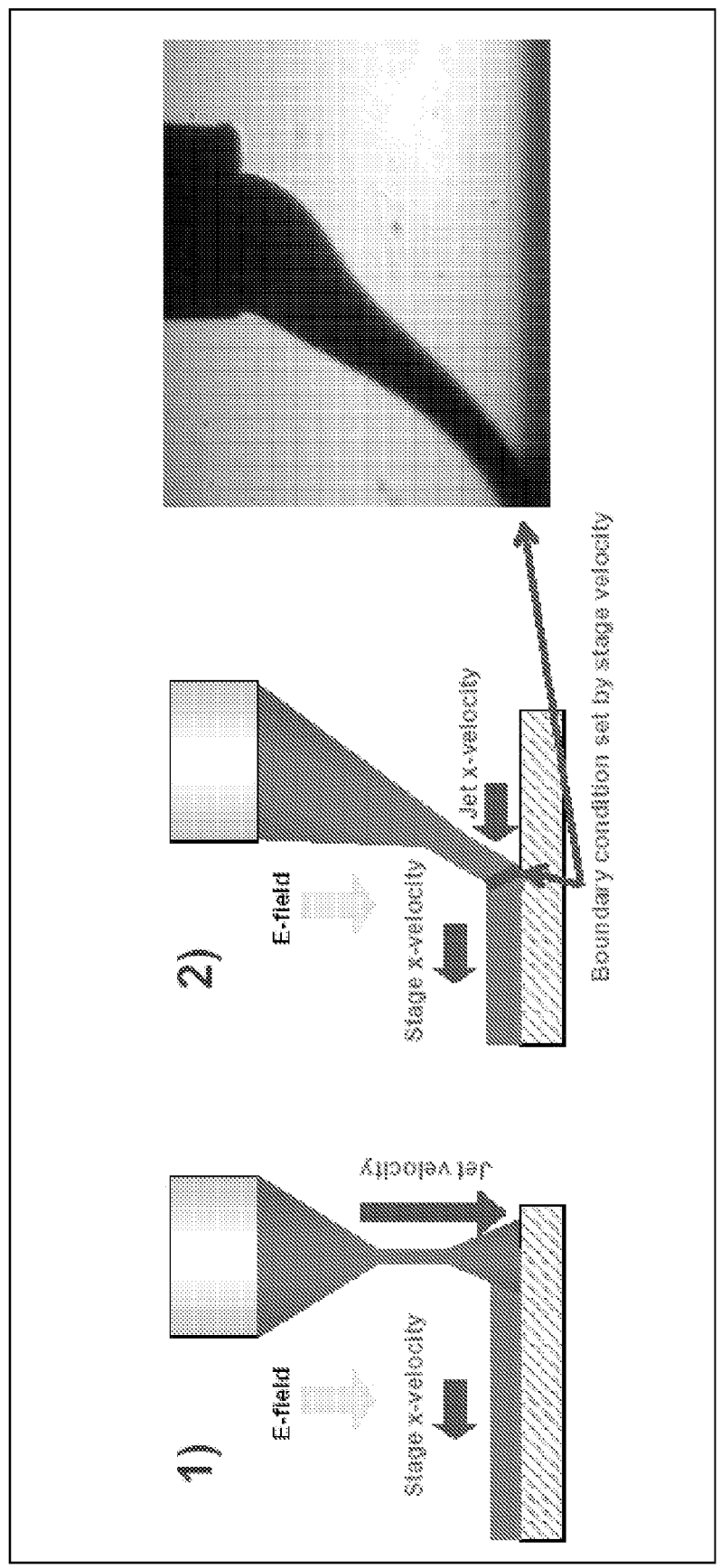
FIGS. 12-13 depict illustrative embodiments for controlling one of the modes of application of FIG. 11.
Figure 13:
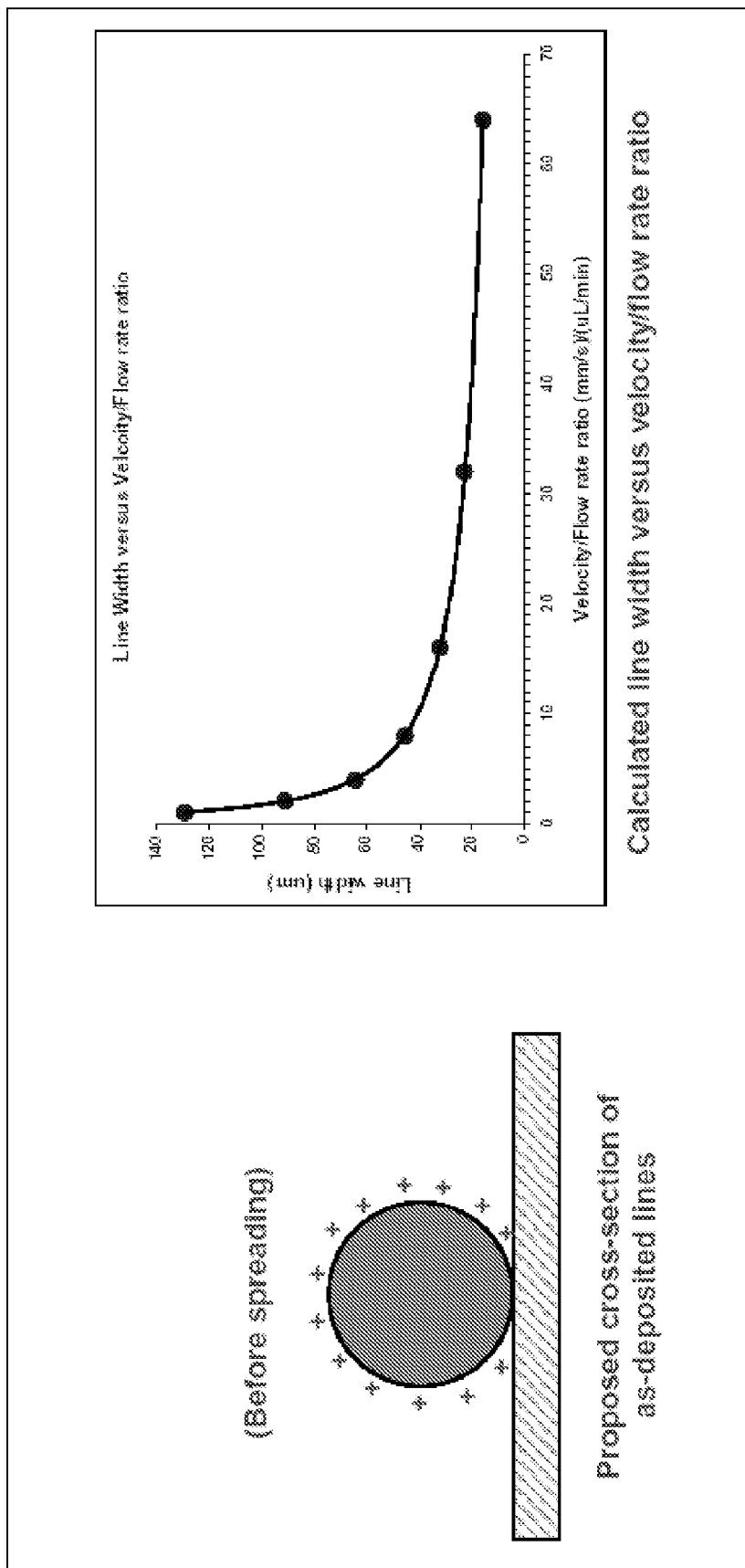

In the Taylor cone contact mode the jet diameter can be controlled in one instance by a ratio of flow rate to stage velocity as shown in FIG. 12. The graph of FIG. 13 illustrates that as the ratio of the stage velocity to flow rate [(mm/s)/(uL/min)] decreases the diameter of the single jet stream increases. And as the ratio increases, the diameter of the single jet stream decreases. Other controllable parameters of the precursor solution can also have an effect on jet diameter such as viscosity, liquid density, surface tension, conductivity, dielectric constant, and so forth.

Figure 14:
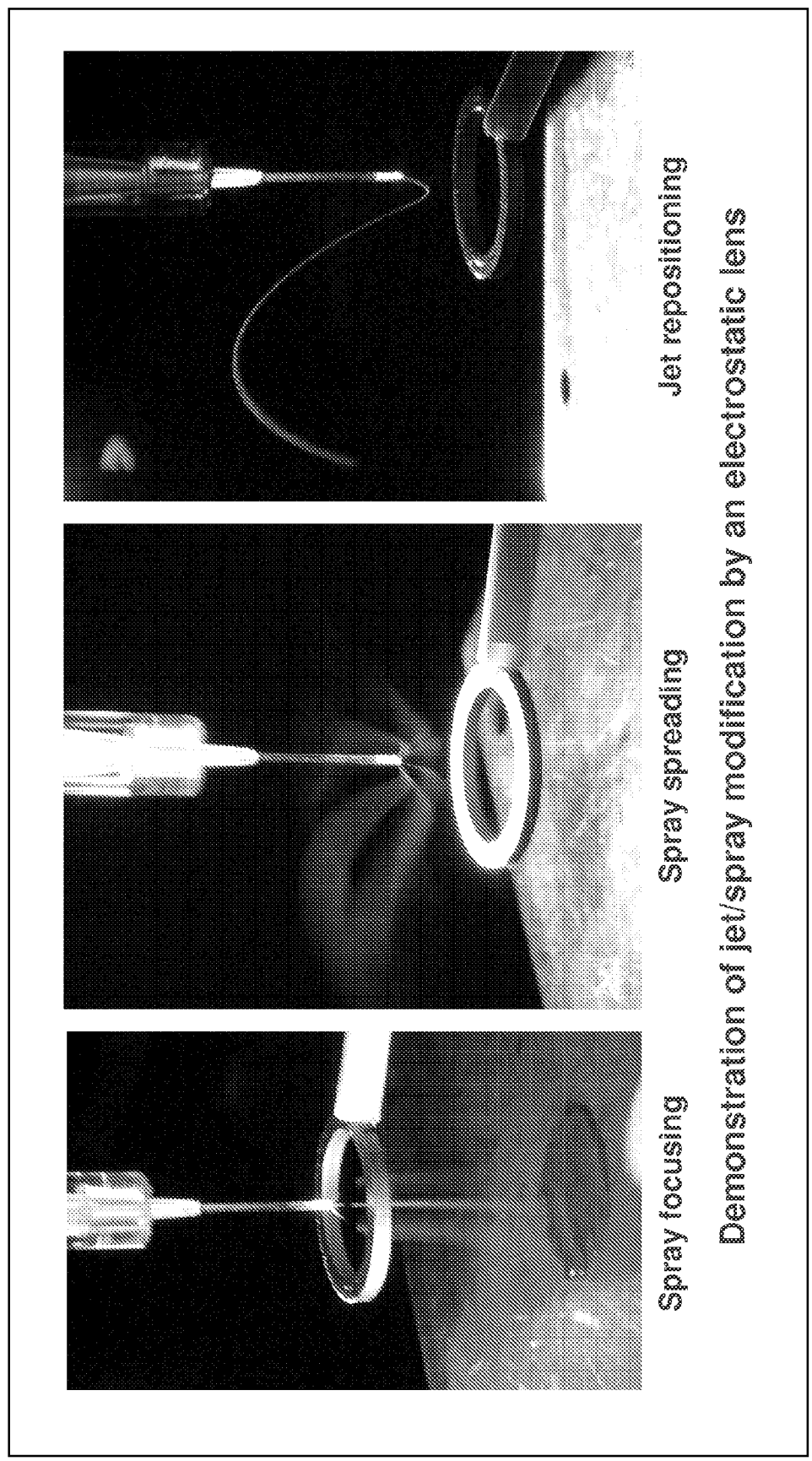
FIG. 14 depicts an illustrative embodiment of a device to manage the application of pattern application.

It should be noted that other devices can be used with apparatus 10 to manipulate the electrically charged single jet stream. For instance, a lens or set of lenses operating by electric, magnetic, or electromagnetic means can be positioned about the single jet stream or coupled to the tube 30 to modify the single jet stream characteristics through electric or magnetic fields. For example, a ring-shaped electrostatic lens such as shown in FIG. 14 can be used to reposition the single jet stream, focus the single jet stream in Spray mode, or spread the single jet stream in Spray mode.

Although not shown, the ring-shaped electrostatic lens can be used to control the single jet stream in the jet with breakup mode, the continuous jet mode, and the Taylor cone contact mode as well. It should also be evident from the illustrations of FIG. 14 that the electrostatic lens can also be used to control the X, Y and/or Z positioning of the single jet stream. Accordingly, the ring-shaped electrostatic lens of FIG. 14 or a derivative thereof can be used as an alternative to using stage 16 (at the substrate and/or applicator 12) or a means complimenting the use of stage 16 (at the substrate and/or applicator 12) for controlling pattern application of the single jet stream on substrate 18. The electrostatic lens can be operably coupled and controlled by the computing resources of the processing circuitry 20 and one or more power supplies.

Other embodiments of the electrostatic lens can include multiple lenses which produce fields oriented in independent axes to reposition or focus the single jet stream in X, Y and/or Z directions through independent control of the field strength and/or position of the lenses. Other geometric shapes of the lens are also possible. For instance, the lens can be square, rectangular, or of a polygon shape with each side of the geometric shape consisting of an electrode insulated from the other segments of the lens. In this configuration, each electrode can be independently operated to produce varying fields that influence the shape of the single jet stream and/or the X, Y, and/or Z application of the electrically charged single jet stream on the substrate 18.

From these illustrations it would be evident to an artisan of ordinary skill in the art that there can be many electrostatic lenses and configurations thereof that can be combined with apparatus 10. These non-disclosed electrostatic lenses and configurations are contemplated by the present disclosure.

Figure 15:
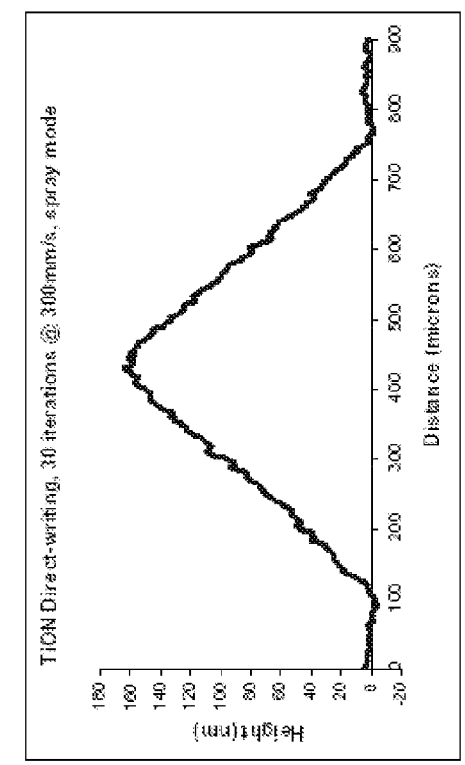
FIGS. 15-22 depict illustrative embodiments of applications of the single jet stream by the apparatus of FIGS. 1-2 or 8 utilizing a number of materials.
Figure 15:
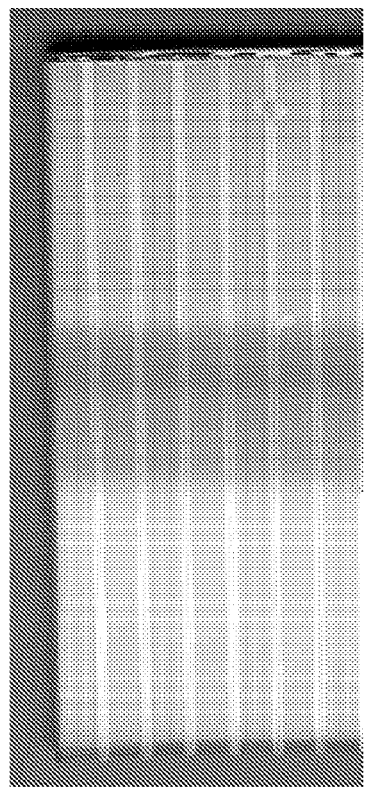
Figure 16:
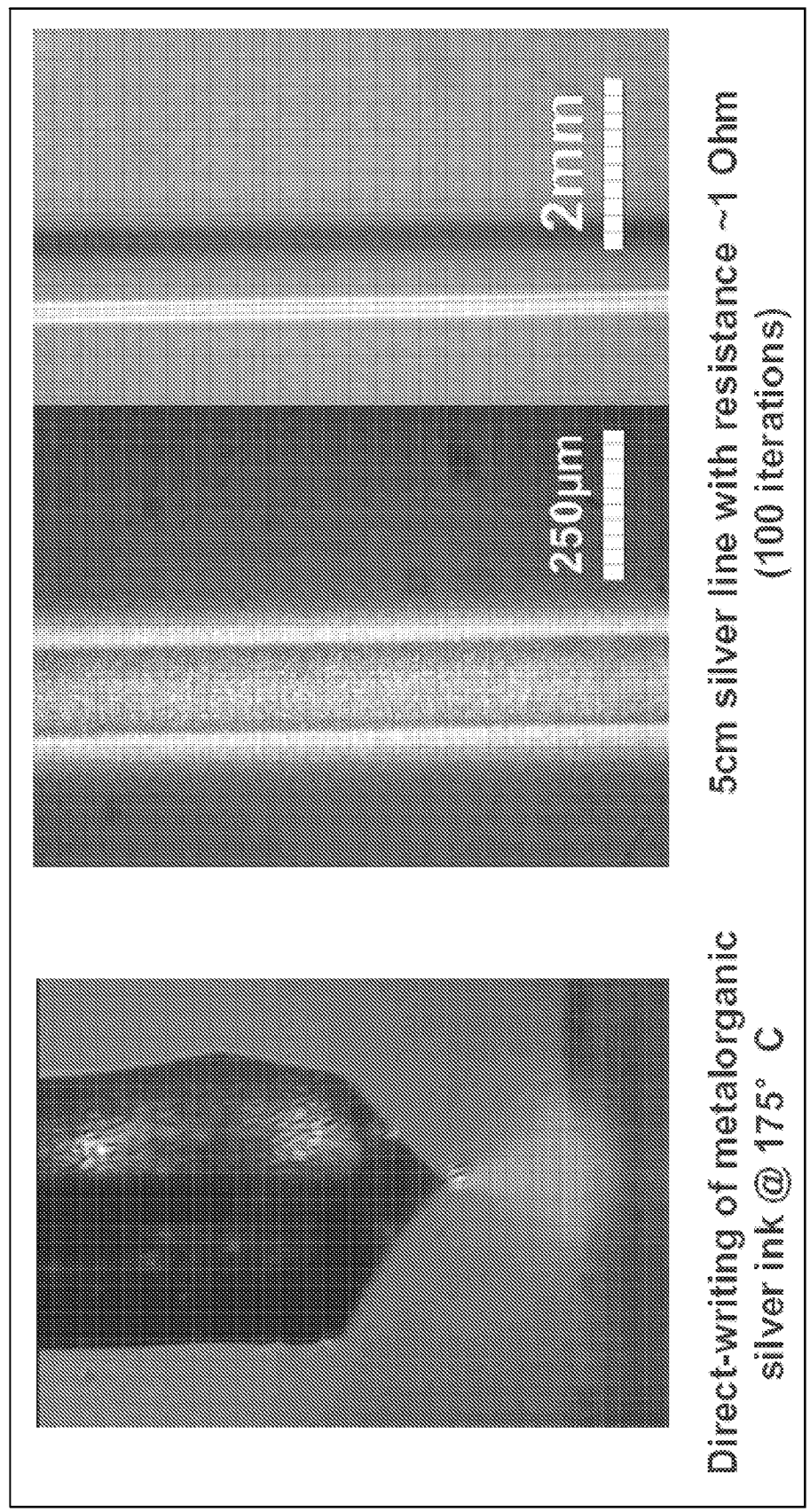

FIGS. 15-22 depict illustrative embodiments of applications of the single jet stream by the apparatus of FIGS. 1-2 or 8 utilizing a number of materials. For instance, FIG. 15 illustrates an application of titanium oxynitride (TiON) patterns deposited by the Spray mode described earlier to generate a unique triangular thickness profile. FIG. 16 illustrates the application of a metalorganic silver ink at 175 degrees Celsius using the Spray mode to directly generate silver patterns without subsequent heat treatment. In this illustration the liquid composition is 0.42 M AgMEAAH in 1:5 DI:n-Propanol; the voltage applied to the conductor 40 is 1.3 kV; the meniscus distance 36 is 600 µm; the flow rate of the liquid is 3 μL/min; the speed of the stage 18 is 300 mm/s; the outer diameter of the nozzle 50 is 600 μm; and water cooling is used to control the application of the silver ink. After 100 iterations, the silver lines consistently maintain a resistance of approximately 1 Ohm. Other compositions are possible.

Figure 17:
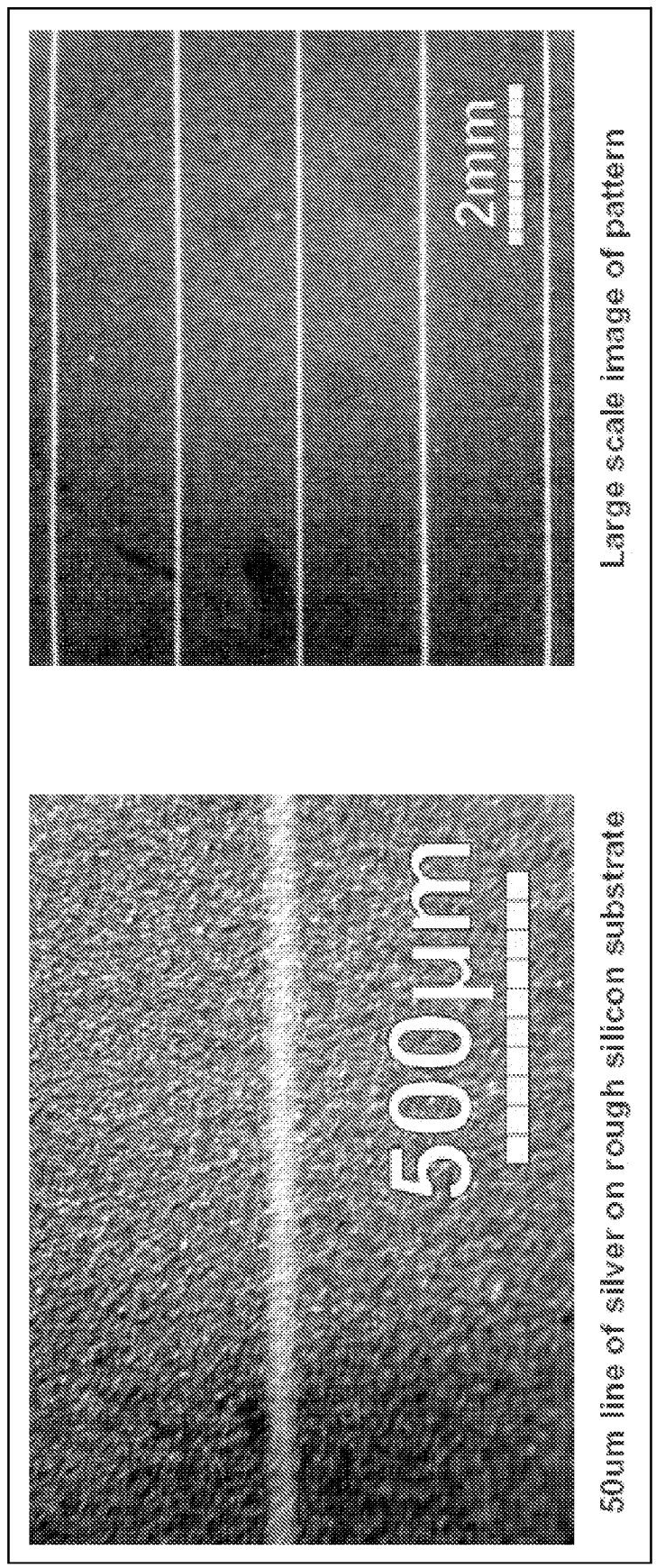
Figure 18:
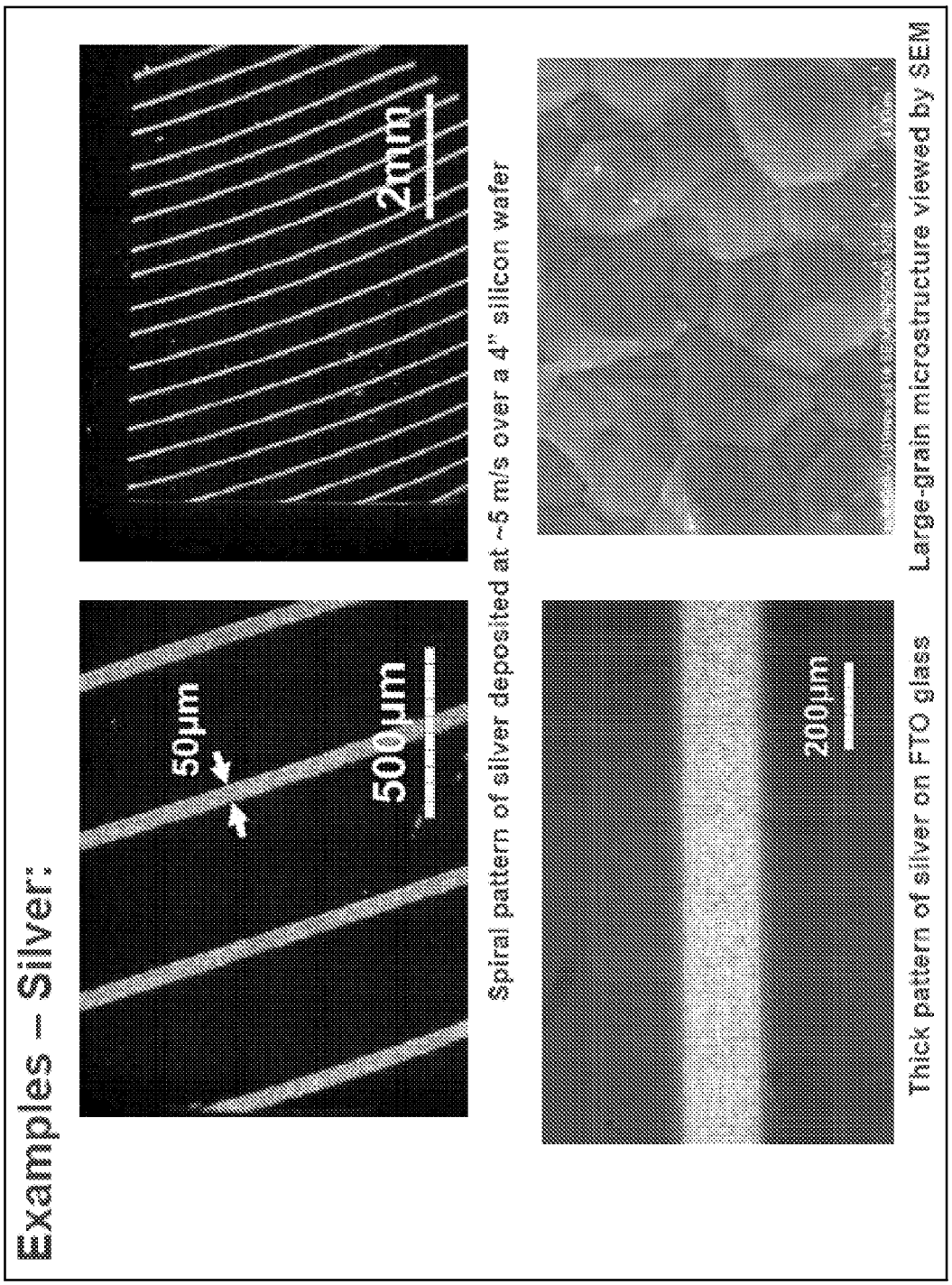
Figure 19:
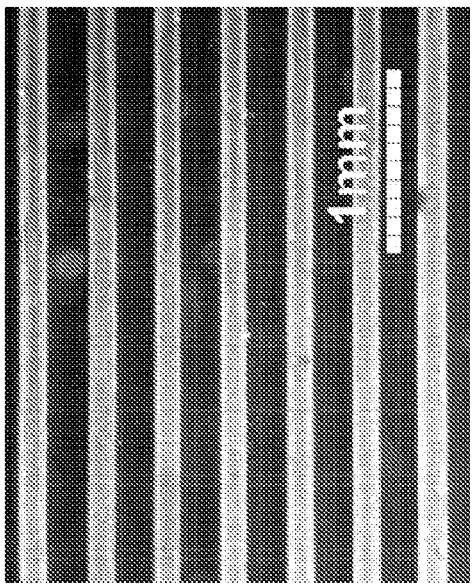
Figure 19:
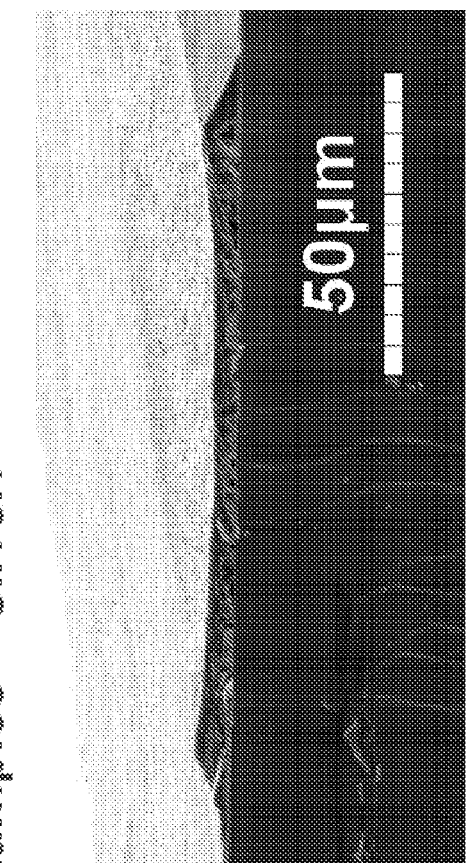
Figure 19:
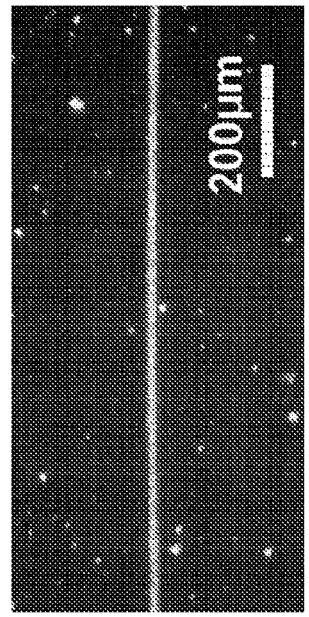
Figure 20:
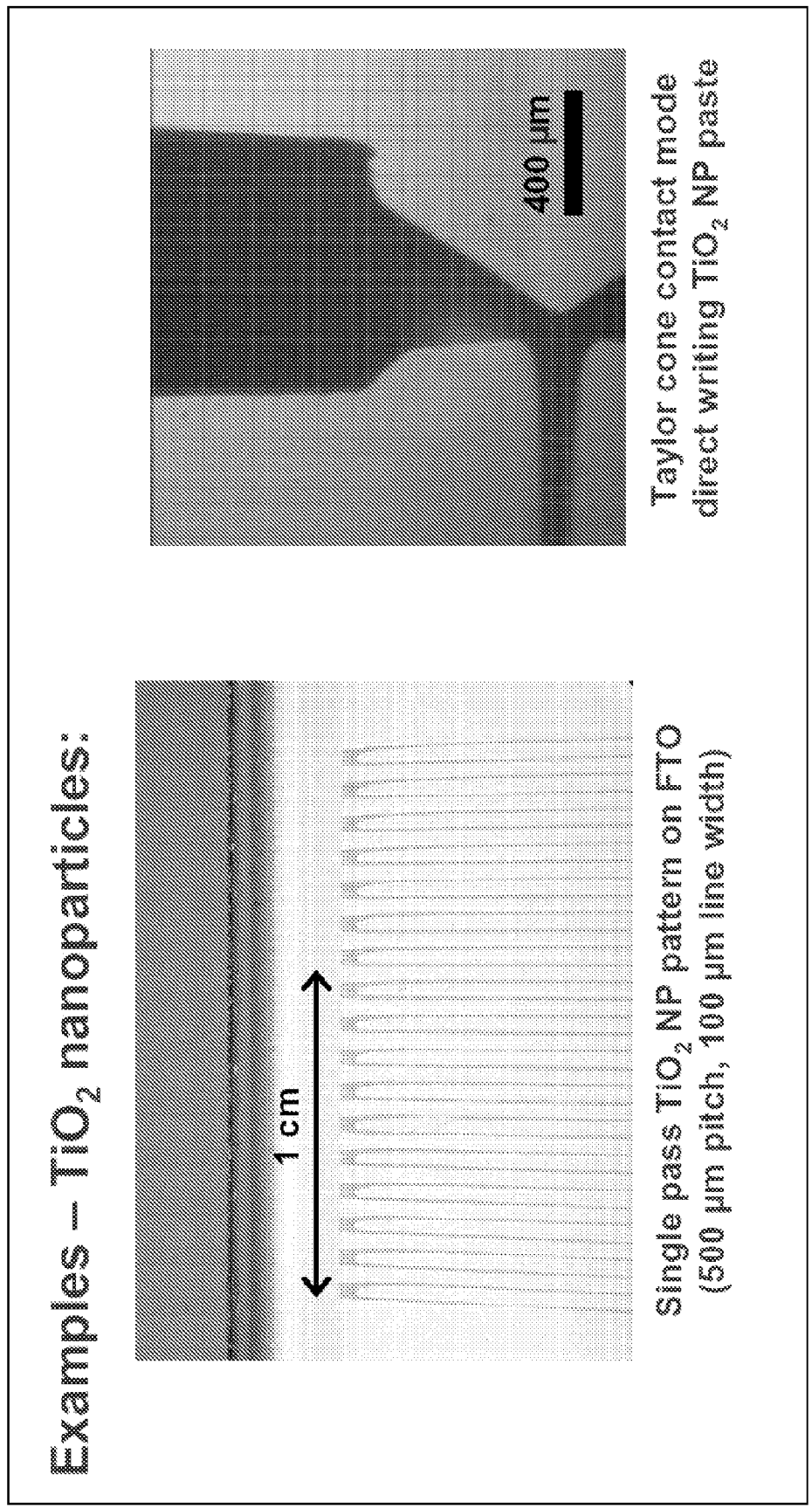

FIG. 17 illustrates how the single jet steam apparatus 10 can be used to apply with consistency and accuracy 50 μm silver lines on a rough substrate. FIG. 18 illustrates the application of spiral patterns with silver deposited by the silver single jet stream at a velocity of 5 m/s over a 4" silicon wafer and FTO glass, respectively. A large-grain microstructure of a silver line is shown using a scanning electron microscope (SEM). FIG. 19 illustrates a silver precursor applied by apparatus 10 on a silicon substrate, silver patterns on ITO glass, and fine silver lines and dots on a $SiO_2$/Si substrate. FIG. 20 illustrates the application of $TiO_2$ nanoparticles by the apparatus 10 on FTO with a 500 μm pitch, and 100 μm line width using the Taylor cone contact mode.

Figure 21:
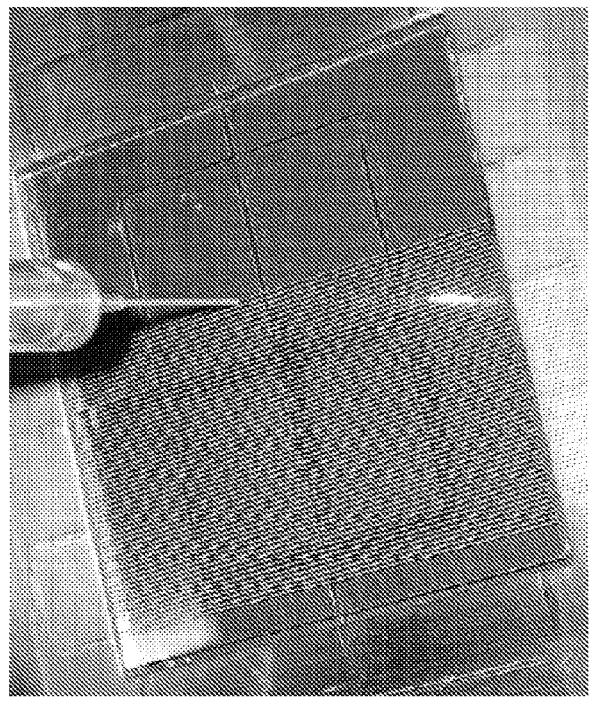
Figure 21:
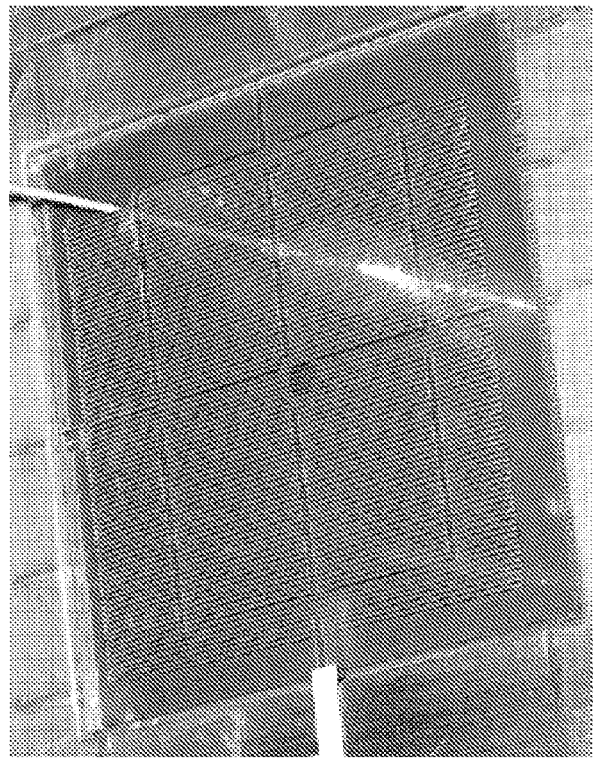
Figure 22:
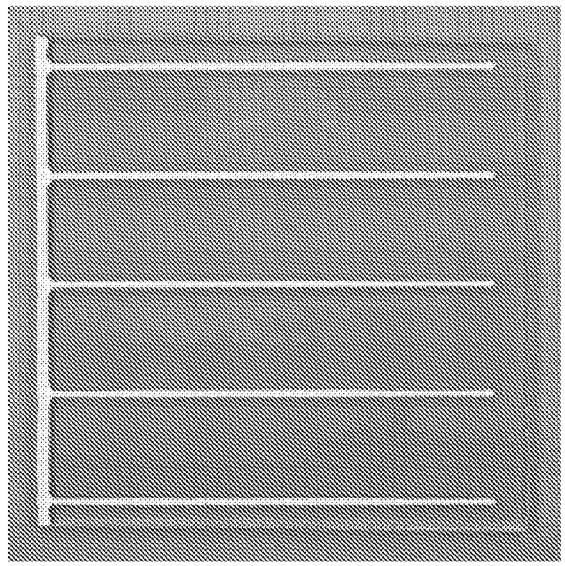
Figure 22:
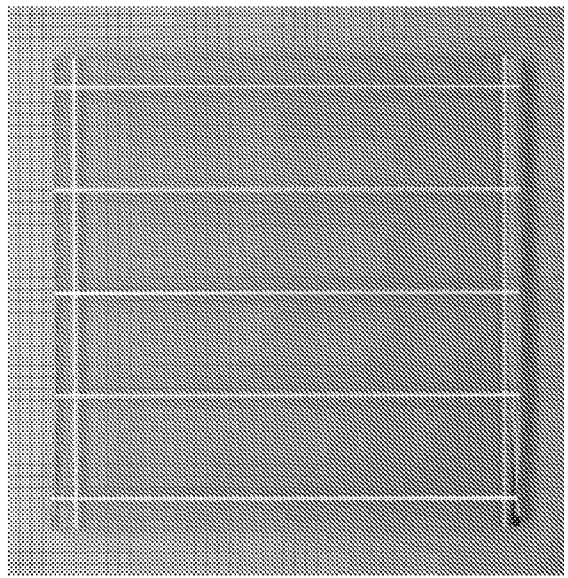

FIG. 21 illustrates patterns written by apparatus 10 on both conductive substrates as well as insulating substrates. These applications can occur provided that significant charge buildup does not occur for a given jet stream flow rate and liquid conductivity, and/or charge dissipation is high enough to prevent significant charge buildup. FIG. 22 illustrates silver grids applied by apparatus 10 on 5 cm×5 cm FTO at 175 degrees Celsius. Silver grids applied at low-temperature with high conductivity can be used in applications such as solar cell current-collection grids, flat-panel display contacts, patterning on flexible polymer substrates for applications such as RFID, and rapid prototyping of printed circuit boards.

Figure 23:
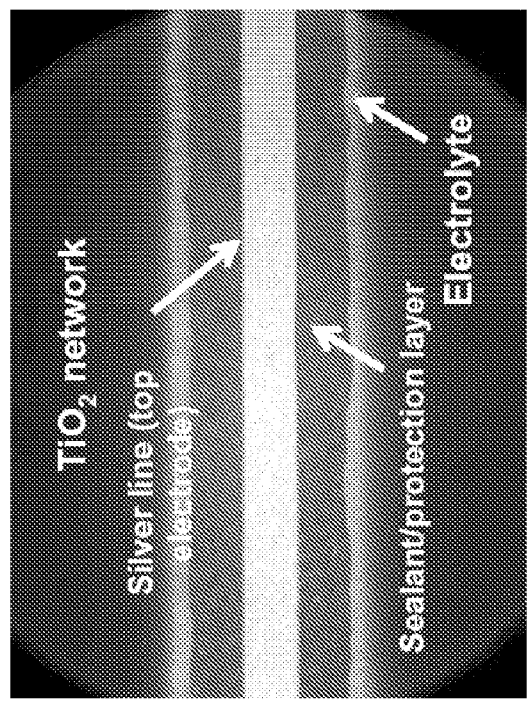
FIGS. 23-26 depict illustrative embodiments of devices manufactured with the pattern application process of the apparatus.
Figure 23:
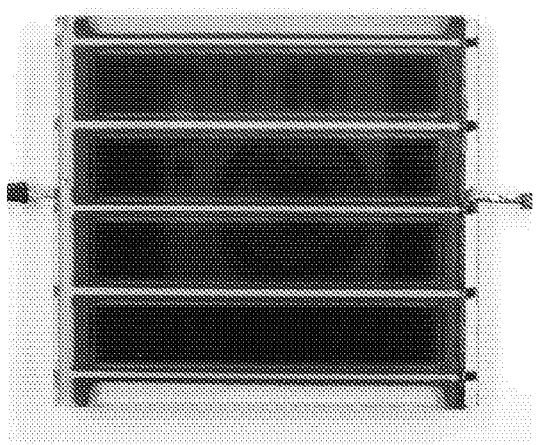
Figure 24:
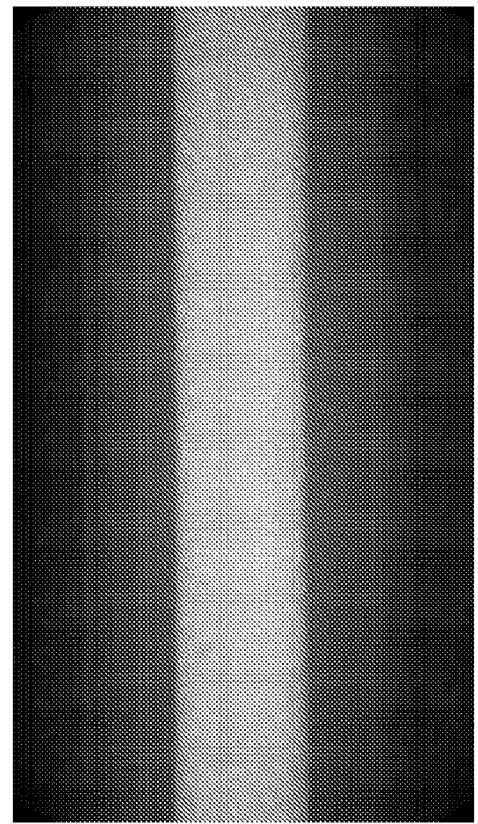
Figure 24:
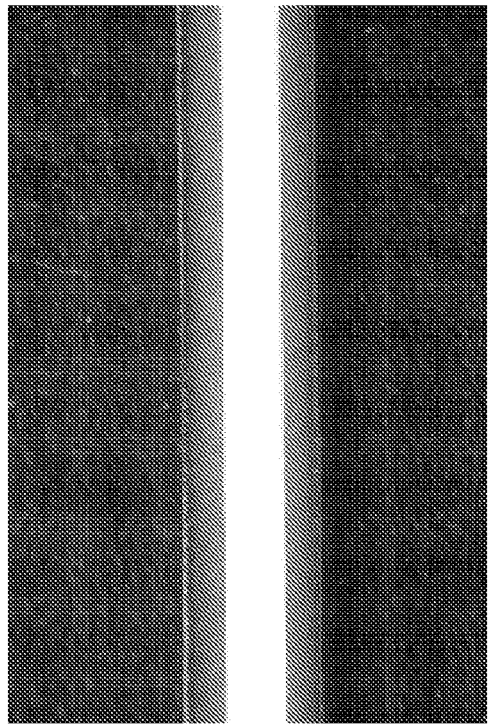

FIGS. 23-26 depict illustrative embodiments of devices manufactured by the pattern application process of apparatus 10. FIG. 23 illustrates dye-sensitized solar cells (DSC) constructed in part with the apparatus 10. The DSC cells in this illustration includes a silver grid, low-temperature glass sealant, a platinum catalyst, and $TiO_2$ nanoparticle network of approximately 15 μm in thickness constructed by pattern application process of apparatus 10. Uniform area coatings can be achieved by adjusting solution viscosities. The application techniques enabled by apparatus 10 permits sealing with a low-temperature glass without degradation of other components of the DSC. FIG. 24 illustrates an optical microscope image of the silver line coated by the glass sealant within the DSC using the application techniques of apparatus 10. As a result of this technique, the silver patterns which are normally degraded in prior art systems by an Iodine electrolyte showed no signs of degradation when coated by a dielectric glass applied by apparatus 10—see FIG. 23. Without the dielectric glass, silver patterns dissolve within hours of being exposed to the Iodine electrolyte. Other protection layers can be applied by apparatus 10 to provide similar results.

Figure 25:
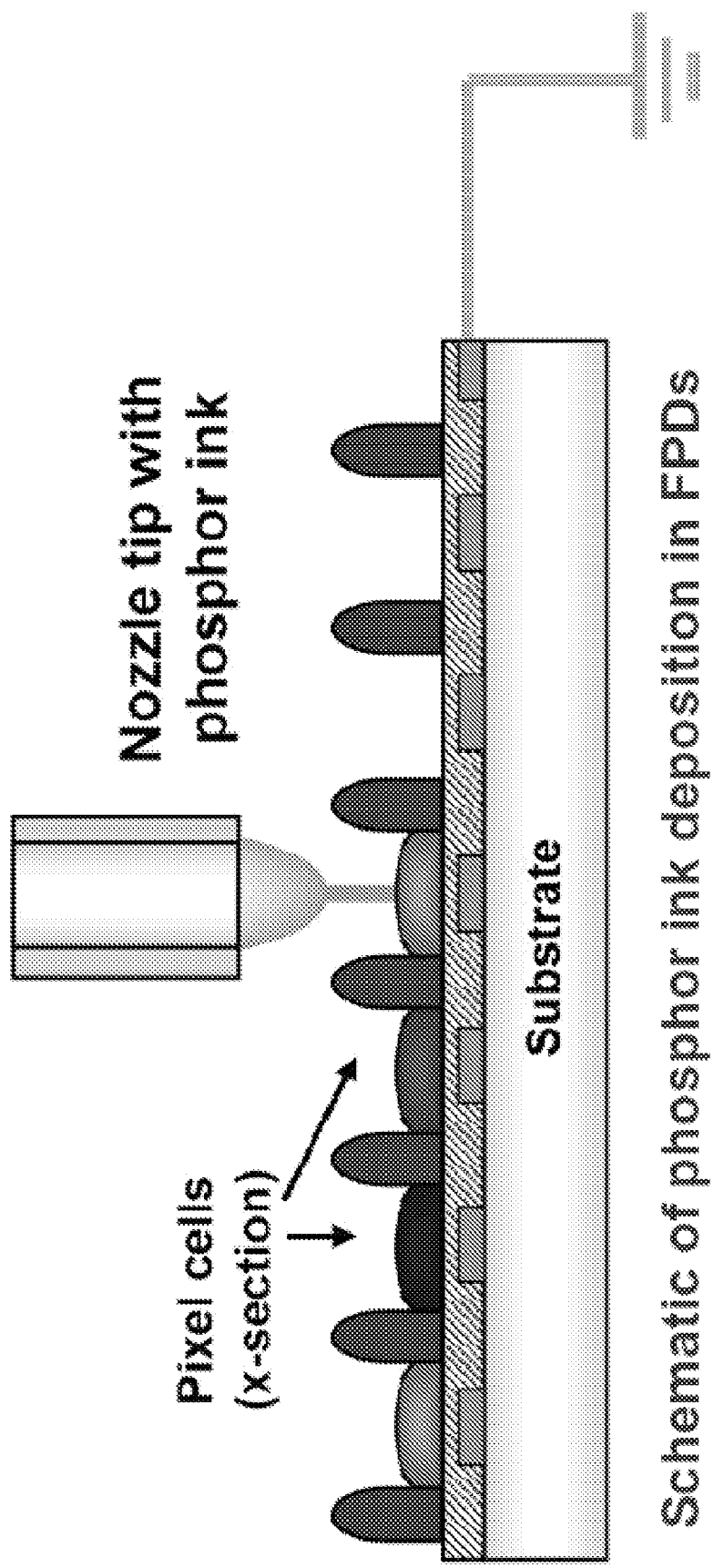
Figure 26:
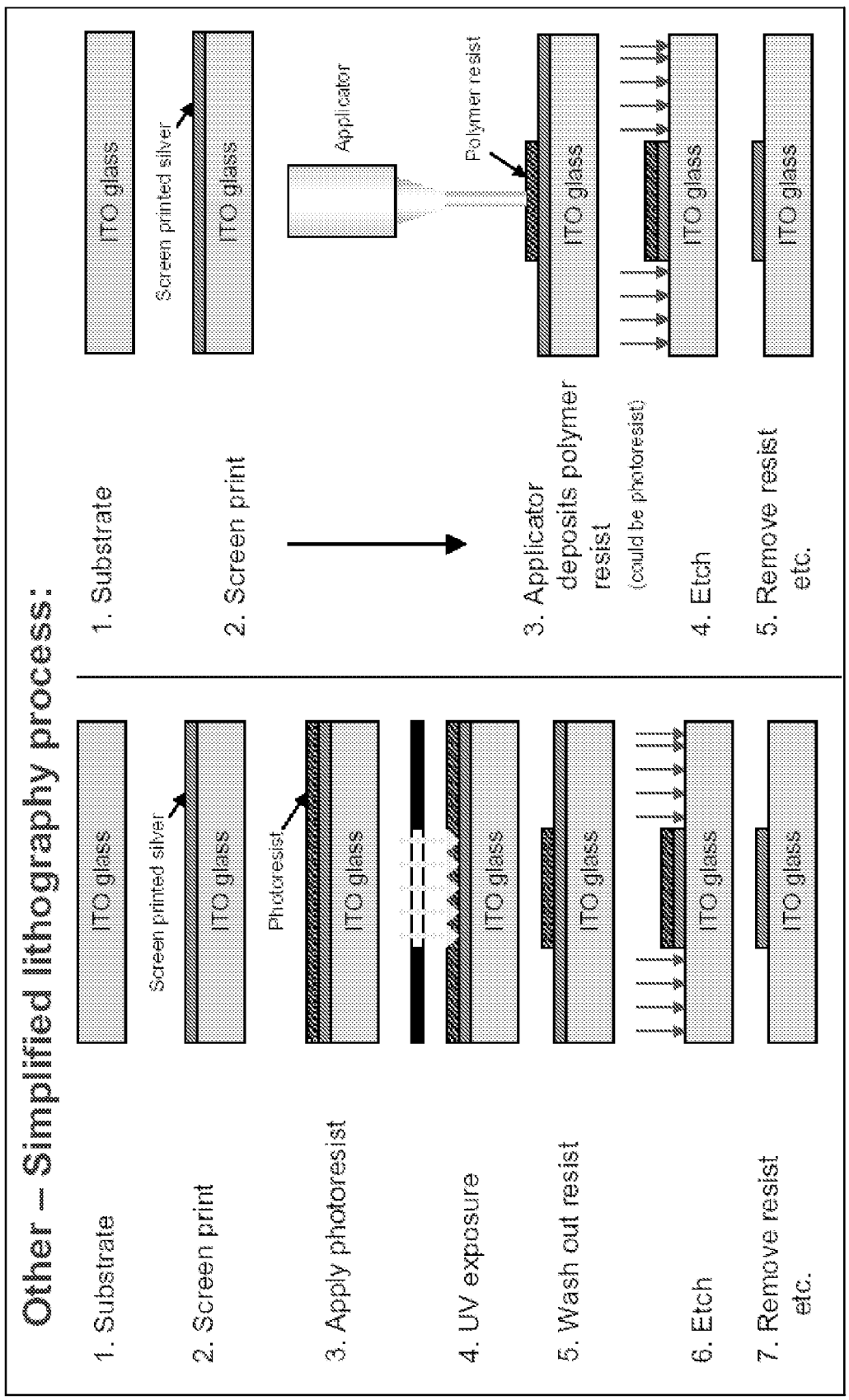

FIG. 25 illustrates an application of materials by apparatus 10 for manufacturing flat-panel displays. A multi-nozzle apparatus such as shown in FIGS. 8-9 can be used to apply on a per nozzle basis different colors of phosphor ink to pixels of a flat-panel display. With a small jet diameter (e.g., less than 10 μm) phosphor can be applied to pixel cells of less than 100 μm. In yet another manufacturing application, applicator 10 can be used to simplify a lithography process as shown in FIG. 26. In FIG. 26, the lithography process shown on the left is a prior art process while the process shown to the right utilizes apparatus 10. The application of a layer of photoresist followed by a UV exposure (steps 3 and 4) of the prior art system can be simplified with apparatus 10. Apparatus 10 can for example accurately deposit a polymer resist (or photoresist) and thereby eliminate the need for UV exposure. In some applications, apparatus 10 can also eliminate the need for screen printing, polymer resist or photoresist, and etching where the target material and the desired pattern of the target material can be applied by the apparatus 10, thereby creating a desired pattern on a substrate in a "single" step.

These illustrative embodiments of the use of apparatus 10 for manufacturing of devices can substantially reduce time to manufacture, improve manufacturing quality, reduce apparatus complexity, and simplify bill of materials, among other things. The stable single jet stream generated by apparatus 10 in its various modes of operation can be accurate, and repeatable, which makes apparatus 10 suitable for manufacturing applications of high volume products. Collectively, these improvements can save device manufacturers substantial cost and effort in the high volume production of integrated circuits, printed circuit boards, and component devices such as displays. Other applications are also possible. For instance, using a metalorganic precursor in solution or paste formed with a solvent and binder, apparatus 10 can be used to apply micrometer solder balls on ball grid arrays (BGAs) or printed circuit boards, which can eliminate the need for screen printing in such applications.

It would be apparent to an artisan with ordinary skill in the art after reviewing the above disclosure that any of the foregoing embodiments can be adapted in numerous ways without departing from the scope and spirit of the claims described below. Accordingly, the reader is directed to the claims for a fuller understanding of the breadth and scope of the present disclosure.

Figure 27:
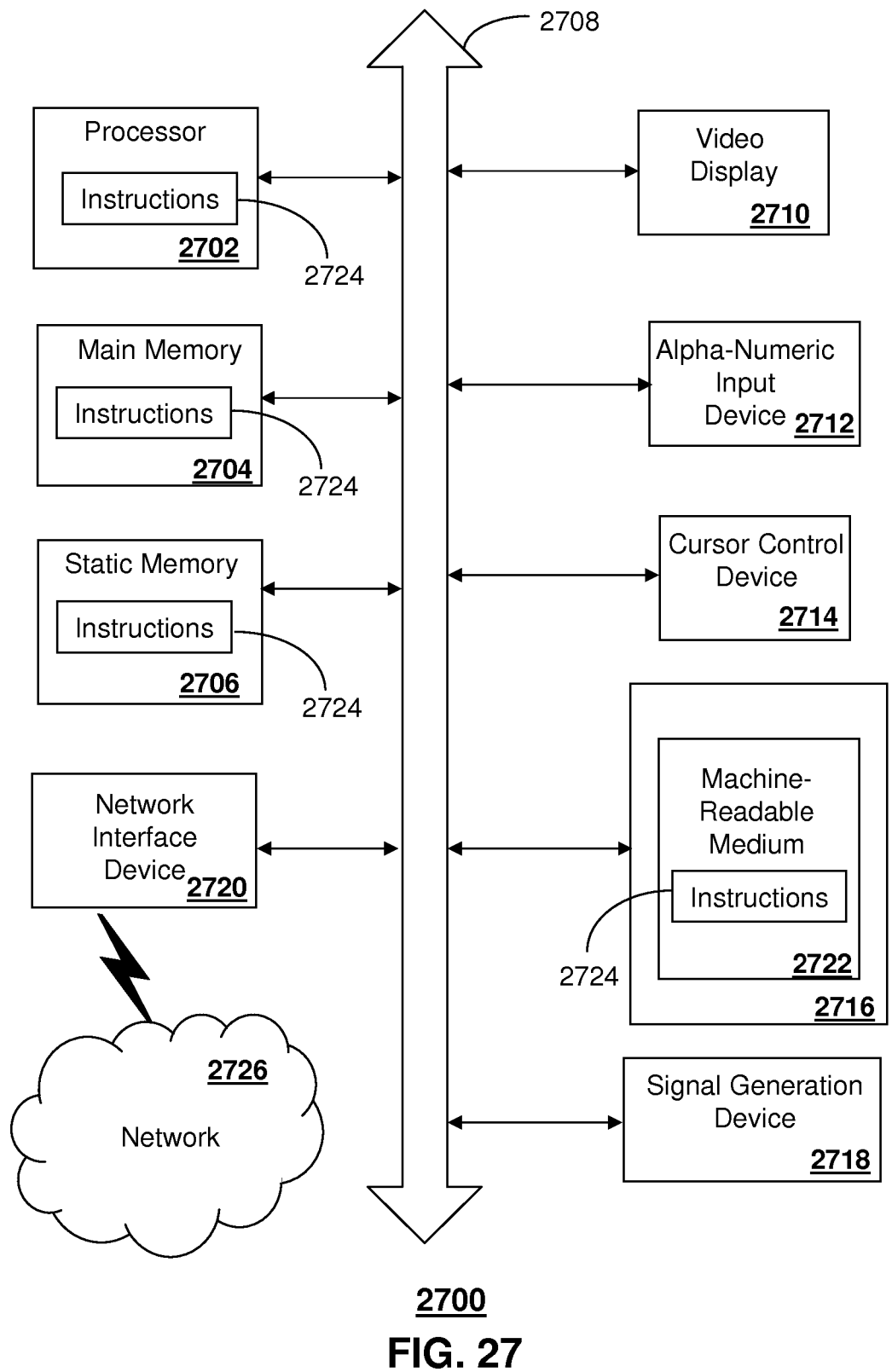
FIG. 27 depicts an illustrative diagrammatic representation of a machine in the form of a computer system within which a set of instructions, when executed, may cause the machine to perform any one or more of the methodologies disclosed herein.

FIG. 27 depicts an illustrative diagrammatic representation of a machine in the form of a computer system 2700 within which a set of instructions, when executed, may cause the machine to perform any one or more of the methodologies discussed above. In some embodiments, the machine operates as a standalone device. In some embodiments, the machine may be connected (e.g., using a network) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a laptop computer, a desktop computer, a control system, a network router, switch or bridge, or any machine capable of executing a set of instructions (sequential or otherwise) that specify actions to be taken by that machine. It will be understood that a device of the present disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methodologies discussed herein.

The computer system 2700 may include a processor 2702 (e.g., a central processing unit (CPU), a graphics processing unit (GPU, or both), a main memory 2704 and a static memory 2706, which communicate with each other via a bus 2708. The computer system 2700 may further include a video display unit 2710 (e.g., a liquid crystal display (LCD), a flat panel, a solid state display, or a cathode ray tube (CRT)). The computer system 2700 may include an input device 2712 (e.g., a keyboard), a cursor control device 2714 (e.g., a mouse), a disk drive unit 2716, a signal generation device 2718 (e.g., a speaker or remote control) and a network interface device 2720.

The disk drive unit 2716 may include a machine-readable medium 2722 on which is stored one or more sets of instructions (e.g., software 2724) embodying any one or more of the methodologies or functions described herein, including those methods illustrated above. The instructions 2724 may also reside, completely or at least partially, within the main memory 2704, the static memory 2706, and/or within the processor 2702 during execution thereof by the computer system 2700. The main memory 2704 and the processor 2702 also may constitute machine-readable media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the present disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

The present disclosure contemplates a machine readable medium containing instructions 2724, or that which receives and executes instructions 2724 from a propagated signal so that a device connected to a network environment 2726 can send or receive voice, video or data, and to communicate over the network 2726 using the instructions 2724. The instructions 2724 may further be transmitted or received over a network 2726 via the network interface device 2720.

While the machine-readable medium 2722 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies of the present disclosure.

The term "machine-readable medium" shall accordingly be taken to include, but not be limited to: solid-state memories such as a memory card or other package that houses one or more read-only (non-volatile) memories, random access memories, or other re-writable (volatile) memories; magneto-optical or optical medium such as a disk or tape; and carrier wave signals such as a signal embodying computer instructions in a transmission medium; and/or a digital file attachment to e-mail or other self-contained information archive or set of archives is considered a distribution medium equivalent to a tangible storage medium. Accordingly, the disclosure is considered to include any one or more of a machine-readable medium or a distribution medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same functions are considered equivalents.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. An apparatus, comprising:
   a tube with an ingress opening to receive a liquid, and an egress opening to release the liquid;
   a conductor positioned in a conduit of the tube, the conductor and the conduit having dimensions to cause a surface tension of the liquid to prevent a constant flow of the liquid from the egress opening, wherein the conductor is a sleeve positioned in the tube, wherein a diameter of the sleeve results in one of the outer surface of the sleeve contacting the surface of the conduit, or the outer surface of the sleeve having a separation from the surface of the conduit of the tube; and
   a power supply coupled to the conductor to apply a charge to the liquid to overcome the surface tension and form at the egress opening a single jet stream of the liquid applicable on a substrate to create a pattern, wherein the single jet stream is controllable in part by a viscosity of the liquid.

2. The apparatus of claim 1, wherein a first portion of a structure of the single jet stream corresponds to an approximation of a Taylor cone extending from the egress opening of the conduit, and wherein a second portion of the structure of the single jet stream corresponds to one of:
   a single stream extending from the Taylor cone and transitioning to droplets before a point of contact of the substrate, the single stream having a smaller diameter than the conduit of the tube;
   the single stream extending from the Taylor cone and transitioning to a spray before the point of contact of the substrate;
   the single stream extending from the Taylor cone and contacting the substrate without noticeably altering the Taylor cone; or
   the single stream extending from the Taylor cone, contacting the substrate, and noticeably altering the Taylor cone.

3. The apparatus of claim 2, wherein the second structure of the single jet stream is controlled by influencing at least one of a flow characteristic of the single stream, a conductivity of the liquid, the viscosity of the liquid, a dielectric constant of the liquid, a surface tension of the liquid, a distance between the substrate and the egress opening of the tube, a voltage applied to the liquid, or a motion between the substrate and the single stream.

4. The apparatus of claim 2, wherein the diameter of the single stream with the noticeable alteration in the Taylor cone is controlled by influencing at least one of a flow characteristic of the single stream or a motion between the substrate and the second structure of the single jet stream.

5. The apparatus of claim 1, wherein the liquid comprises a precursor solution, and wherein the precursor solution comprises at least one of a metal, a metal compound, a sol-gel processed material, a polymer, an oligomer, an oxide, a ceramic, an organic material, a biomaterial, a biological material, or a solvent combined with at least one thereof.

6. The apparatus of claim 1, comprising one of a reservoir or a device that feeds the liquid into the tube.

7. The apparatus of claim 1, wherein the constant flow of the liquid is prevented by the surface tension of the liquid and its viscosity while the conductor is approximately electrically neutral.

8. The apparatus of claim 1, comprising an imaging system to determine a quality of at least one of the single jet stream or an application of the single jet stream on the substrate.

9. The apparatus of claim 1, comprising a temperature application device coupled to at least a portion of the apparatus to control a temperature of at least one of the substrate or the single jet stream.

10. The apparatus of claim 9, comprising a thermal sensor device to sense the temperature of at least one of the substrate or the single jet stream.

11. The apparatus of claim 1, comprising a device to propel the liquid into the ingress opening of the tube.

12. The apparatus of claim 1, comprising a position altering apparatus coupled to the substrate to shift the substrate in at least one plane to create a pattern on the substrate with the single jet stream.

13. The apparatus of claim 1, comprising a position altering apparatus coupled to the tube to shift the tube in at least one plane to create a pattern on the substrate with the single jet stream.

14. The apparatus of claim 1, comprising a housing assembly to hermetically seal a portion of the apparatus.

15. The apparatus of claim 14, comprising a device to cause one of an injection of a gas in the housing assembly, an injection of a fluid in the housing assembly, or cause an approximate vacuum in the housing assembly.

16. The apparatus of claim 1, comprising a controller to manage operation of portions of the apparatus to apply the pattern on the substrate.

17. The apparatus of claim 16, wherein the pattern has one or more dimensions.

18. The apparatus of claim 1, comprising a removable obstruction to obstruct an application of the liquid to the substrate.

19. The apparatus of claim 18, wherein the removable obstruction comprises a shutter controllable by an actuator to cause an obstruction of the application of the liquid to the substrate, or to cause a removal of the obstruction of the application of the liquid to the substrate.

20. The apparatus of claim 1, comprising one or more additional tubes with a corresponding conductor positioned in each additional tube, each conductor coupled to the power supply or a different power supply, wherein each additional tube receives by way of an ingress opening of a conduit of the tube the liquid or a different liquid, wherein each additional tube emits an additional single jet stream by way of an egress opening of the conduit of the tube responsive to a charge applicable by its conductor by way of its corresponding power supply.

21. The apparatus of claim 20, comprising a controller to cause the apparatus to synchronously or asynchronously generate a plurality of single jet streams applicable on one of the substrate, one or more additional substrates, or a combination thereof.

22. The apparatus of claim 1, comprising an electric, magnetic, or electromagnetic device to manipulate the charged single jet stream.

23. The apparatus of claim 22, wherein the electric, magnetic, or electromagnetic device corresponds to one of an electromagnetic coil or an electromagnetic lens positioned about the single jet stream.

24. The apparatus of claim 23, wherein the electric, magnetic, or electromagnetic lens has one of a ring-shaped or polygon-shaped geometry.

25. The apparatus of claim 22, wherein each of one or more portions of the electric, magnetic, or electromagnetic device independently generates fields for influencing the charged single jet stream.

* * * * *